US009472538B2

(12) United States Patent
Inokuchi et al.

(10) Patent No.: US 9,472,538 B2
(45) Date of Patent: Oct. 18, 2016

(54) SEMICONDUCTOR DEVICE MANUFACTURING METHOD AND SEMICONDUCTOR DEVICE

(71) Applicant: Mitsubishi Electric Corporation, Tokyo (JP)

(72) Inventors: Seiichiro Inokuchi, Tokyo (JP); Mitsunori Aiko, Tokyo (JP); Shintaro Araki, Tokyo (JP); Natsuki Tsuji, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/785,314

(22) PCT Filed: Jul. 4, 2013

(86) PCT No.: PCT/JP2013/068408

§ 371 (c)(1),
(2) Date: Oct. 16, 2015

(87) PCT Pub. No.: WO2015/001648

PCT Pub. Date: Jan. 8, 2015

(65) Prior Publication Data

US 2016/0079221 A1    Mar. 17, 2016

(51) Int. Cl.
*H01L 21/00* (2006.01)
*H01L 25/18* (2006.01)
(Continued)

(52) U.S. Cl.
CPC ........... *H01L 25/18* (2013.01); *H01L 21/4825* (2013.01); *H01L 21/565* (2013.01);
(Continued)

(58) Field of Classification Search
CPC .................. H01L 23/051; H01L 2924/15787; H01L 21/565; H01L 2224/48247; H01L 23/3121; H01L 24/40

USPC .................. 438/124, 126, 127; 257/787, 790
See application file for complete search history.

(56) References Cited

U.S. PATENT DOCUMENTS 8,455,986 B2*   6/2013   Kajiwara ............. H01L 23/495
                                                          257/673
2003/0003630 A1   1/2003   Iimura et al.
(Continued)

FOREIGN PATENT DOCUMENTS

| JP | H04-137754   | 5/1992 |
| JP | H04-199552 A | 7/1992 |

(Continued)

OTHER PUBLICATIONS

Notification of Transmittal of Translation of the International Preliminary Report on Patentability and Translation of Written Opinion of the International Searching Authority; PCT/JP2013/068408, issued on Jan. 14, 2016.

(Continued)

*Primary Examiner* — S. V. Clark
(74) *Attorney, Agent, or Firm* — Studebaker & Brackett PC

(57) ABSTRACT

Fixing a semiconductor element to a substrate, electrically connecting signal and main terminals to the semiconductor element, a terminal aggregate includes a frame portion, the signal terminal, the main terminal, which has a larger width than the signal terminal, and a dummy terminal, and forming a to-be-encapsulated body in which the substrate, the semiconductor element, and the terminal aggregate are integrated, mounting the to-be-encapsulated body on a lower mold half such that a plurality of blocks formed in the lower mold half are meshed with the signal, main, and dummy terminals with no space left therebetween after the mounting, placing a bottom surface of an upper mold half on top surfaces of the plurality of blocks, and top surfaces of the signal, main, and dummy terminals to form a cavity for the substrate and the semiconductor element, and performing molding by injecting mold resin into the cavity are included.

30 Claims, 37 Drawing Sheets

(51) Int. Cl.
*H01L 25/07* (2006.01)
*H01L 23/051* (2006.01)
*H01L 23/31* (2006.01)
*H01L 21/56* (2006.01)
*H01L 23/433* (2006.01)
*H01L 23/495* (2006.01)
*H01L 23/00* (2006.01)
*H01L 21/48* (2006.01)
*H01L 23/367* (2006.01)
*H01L 23/48* (2006.01)
*H01L 23/50* (2006.01)
*H01L 23/522* (2006.01)

(52) U.S. Cl.
CPC ......... *H01L23/051* (2013.01); *H01L 23/3107* (2013.01); *H01L 23/3121* (2013.01); *H01L 23/3675* (2013.01); *H01L 23/4334* (2013.01); *H01L 23/481* (2013.01); *H01L 23/49541* (2013.01); *H01L 23/49562* (2013.01); *H01L 23/49575* (2013.01); *H01L 23/49589* (2013.01); *H01L 23/50* (2013.01); *H01L 23/5228* (2013.01); *H01L 24/36* (2013.01); *H01L 24/40* (2013.01); *H01L 25/07* (2013.01); *H01L 2224/05553* (2013.01); *H01L 2224/0603* (2013.01); *H01L 2224/40137* (2013.01); *H01L 2224/48137* (2013.01); *H01L 2224/48139* (2013.01); *H01L 2224/48247* (2013.01); *H01L 2224/48472* (2013.01); *H01L 2924/13055* (2013.01); *H01L 2924/13091* (2013.01); *H01L 2924/15787* (2013.01); *H01L 2924/181* (2013.01)

(56) References Cited

U.S. PATENT DOCUMENTS

| | | |
|---|---|---|
| 2003/0075786 A1 | 4/2003 | Joshi et al. |
| 2004/0089931 A1 | 5/2004 | Nakajima et al. |
| 2006/0060982 A1 | 3/2006 | Ikawa et al. |
| 2008/0012045 A1 | 1/2008 | Muto et al. |
| 2008/0106160 A1* | 5/2008 | Yoshinari .......... H01L 23/49531 310/68 D |
| 2008/0119065 A1 | 5/2008 | Takakusaki et al. |
| 2010/0133667 A1 | 6/2010 | Oka et al. |
| 2011/0215400 A1 | 9/2011 | Nakamura et al. |
| 2012/0161303 A1 | 6/2012 | Tomita |
| 2013/0241047 A1* | 9/2013 | Omae ............... H01L 23/49524 257/712 |
| 2014/0367846 A1* | 12/2014 | Nakagawa ........ H01L 23/49541 257/713 |

FOREIGN PATENT DOCUMENTS

| | | |
|---|---|---|
| JP | H04-284656 | 10/1992 |
| JP | H05-251616 A | 9/1993 |
| JP | H06-7275 U | 1/1994 |
| JP | H07-14951 A | 1/1995 |
| JP | H11-251508 | 9/1999 |
| JP | 2000-138342 | 5/2000 |
| JP | 2002-237558 | 8/2002 |
| JP | 2003-017518 | 1/2003 |
| JP | 2004-165406 | 6/2004 |
| JP | 2005-051109 | 2/2005 |
| JP | 2005-129826 | 5/2005 |
| JP | 2005-515618 | 5/2005 |
| JP | 2006-093255 | 4/2006 |
| JP | 2006-173649 | 6/2006 |
| JP | 2006-253734 | 9/2006 |
| JP | 2008-021796 | 1/2008 |
| JP | 2008-112932 | 5/2008 |
| JP | 2008-135735 | 6/2008 |
| JP | 2008-198921 | 8/2008 |
| JP | 2009-188327 | 8/2009 |
| JP | 2009-206406 | 9/2009 |
| JP | 2010-129795 | 6/2010 |
| JP | 2010-192591 | 9/2010 |
| JP | 2011-187650 | 9/2011 |
| JP | 2012-142466 | 7/2012 |
| WO | 2011/048719 A1 | 4/2011 |

OTHER PUBLICATIONS

International Search Report issued in PCT/JP2013/068408, mailed Sep. 3, 2013.
An Office Action; "Notification of Reason for Rejection," issued by the Japanese Patent Office on Jun. 14, 2016, which corresponds to Japanese Patent Application No. 2015-524976 and is related to U.S. Appl. No. 14/785,314; with English language partial translational.

* cited by examiner

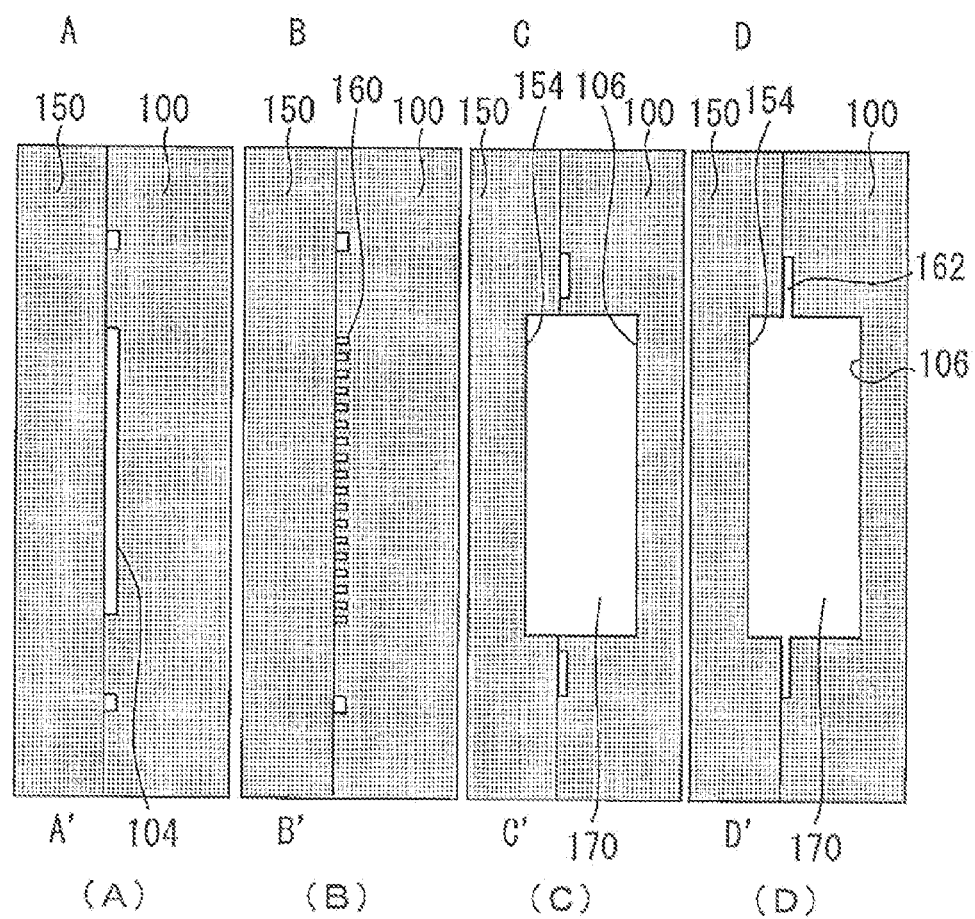
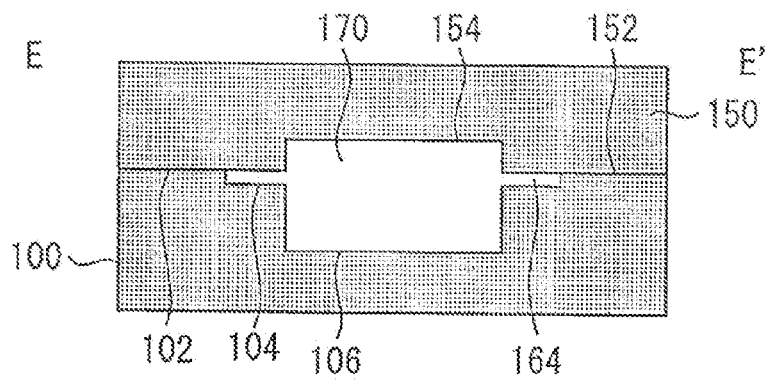

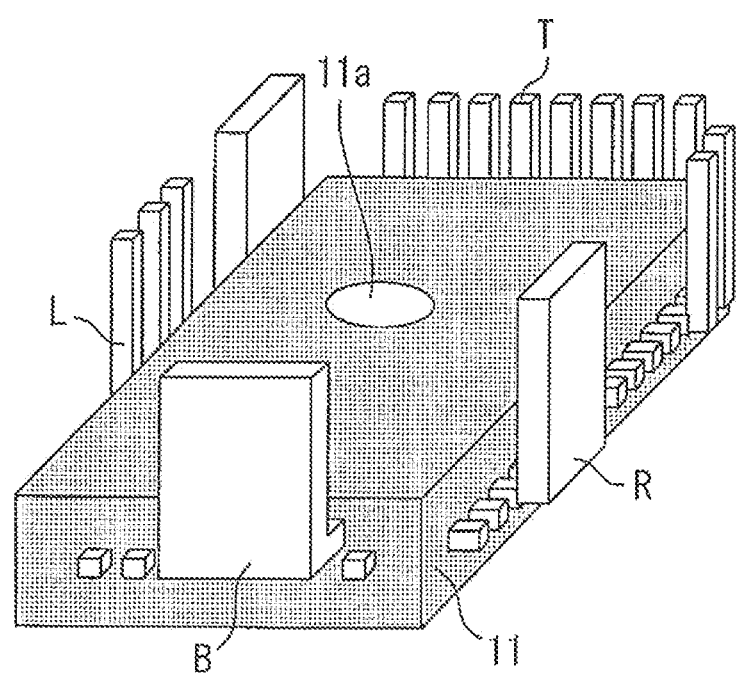

SEMICONDUCTOR DEVICE MANUFACTURING METHOD AND SEMICONDUCTOR DEVICE

TECHNICAL FIELD

This invention relates to a method of manufacturing a semiconductor device for use in, for example, the switching of a large current or the like and a semiconductor device manufactured by the method.

BACKGROUND ART

Patent Document 1 discloses the mounting of a semiconductor element on a lead frame including a plurality of leads (terminals) and dummy leads (dummy terminals). This lead frame is set in a mold and then encapsulated in mold resin.

PRIOR ART

Patent Literature

Patent Literature 1: Japanese Patent Laid-Open No. 2006-173649

SUMMARY OF INVENTION

Problems to be Solved by the Invention

A semiconductor device which handles a large current includes main terminals through which a main current is passed and signal terminals for transmitting control signals. One end of each of these terminals is connected to a semiconductor element inside the mold resin, and other end thereof extends to the outside of the mold resin. A mold for use in the formation of the mold resin needs to have a shape appropriate for the arrangement of the terminals. Further, since the arrangement of main terminals and signal terminals varies depending on semiconductor device products, there has been a problem that a mold is required for each semiconductor device product. Preparing different molds for different semiconductor device products increases cost. Moreover, since changing molds takes time, production efficiency decreases.

The present invention has been made to solve the above-described problems, and an object of the present invention is to provide a semiconductor device manufacturing method in which resin encapsulation can be performed on a plurality of semiconductor device products using a single mold, and a semiconductor device manufactured by the method.

Means for Solving the Problems

According to the present invention, there is provided a semiconductor device manufacturing method including the steps of fixing a semiconductor element to a substrate, electrically connecting a signal terminal and a main terminal of a terminal aggregate to the semiconductor element, the terminal aggregate includes a frame portion, the signal terminal connected to an inside of the frame portion, the main terminal connected to the inside of the frame portion to have a larger width than the signal terminal, and a dummy terminal connected to the inside of the frame portion, and forming a to-be-encapsulated body in which the substrate, the semiconductor element, and the terminal aggregate are integrated, mounting the to-be-encapsulated body on a lower mold half such that a plurality of blocks formed in the lower mold half are meshed with the signal terminal, the main terminal, and the dummy terminal with no space left therebetween, after the mounting step, placing a bottom surface of an upper mold half on top surfaces of the plurality of blocks, a top surface of the signal terminal, a top surface of the main terminal, and a top surface of the dummy terminal with no space left therebetween to form a cavity for placing the substrate and the semiconductor element, and performing molding by injecting mold resin into the cavity.

According to the present invention, there is also provided a semiconductor device including a substrate, a semiconductor element fixed to the substrate, a signal terminal for transmitting a signal for switching the semiconductor element between on and off, a main terminal through which a main current of the semiconductor element is passed, the main terminal being formed to have a larger width than the signal terminal, a dummy terminal not electrically connected to the semiconductor element, and a mold resin covering the semiconductor element and the substrate with portions of the signal terminal, the main terminal, and the dummy terminal being exposed to an outside.

Other features of the present invention will be clarified in the following.

Advantageous Effect of Invention

This invention makes it possible to perform resin encapsulation on a plurality of semiconductor device products having different terminal arrangements using a single mold.

BRIEF DESCRIPTION OF DRAWINGS

FIG. 10A is a cross-sectional view taken along line A-A' of FIG. 8.

FIG. 10B is a cross-sectional view taken along line B-B' of FIG. 8.

FIG. 10C is a cross-sectional view taken along line C-C' of FIG. 8.

FIG. 10D is a cross-sectional view taken along line D-D' of FIG. 8.

FIG. 11 is a cross-sectional view taken along line E-E' of FIG. 8.

FIG. 47 is a perspective view of a semiconductor device according to embodiment 14 of the present invention.

DESCRIPTION OF THE EMBODIMENTS

Semiconductor device manufacturing methods and semiconductor devices according to embodiments of the present invention will be described with reference to the drawings. The same or corresponding components will be denoted by the same reference signs, and the repetition of explanation thereof may be omitted.

Embodiment 1

Figure 1:
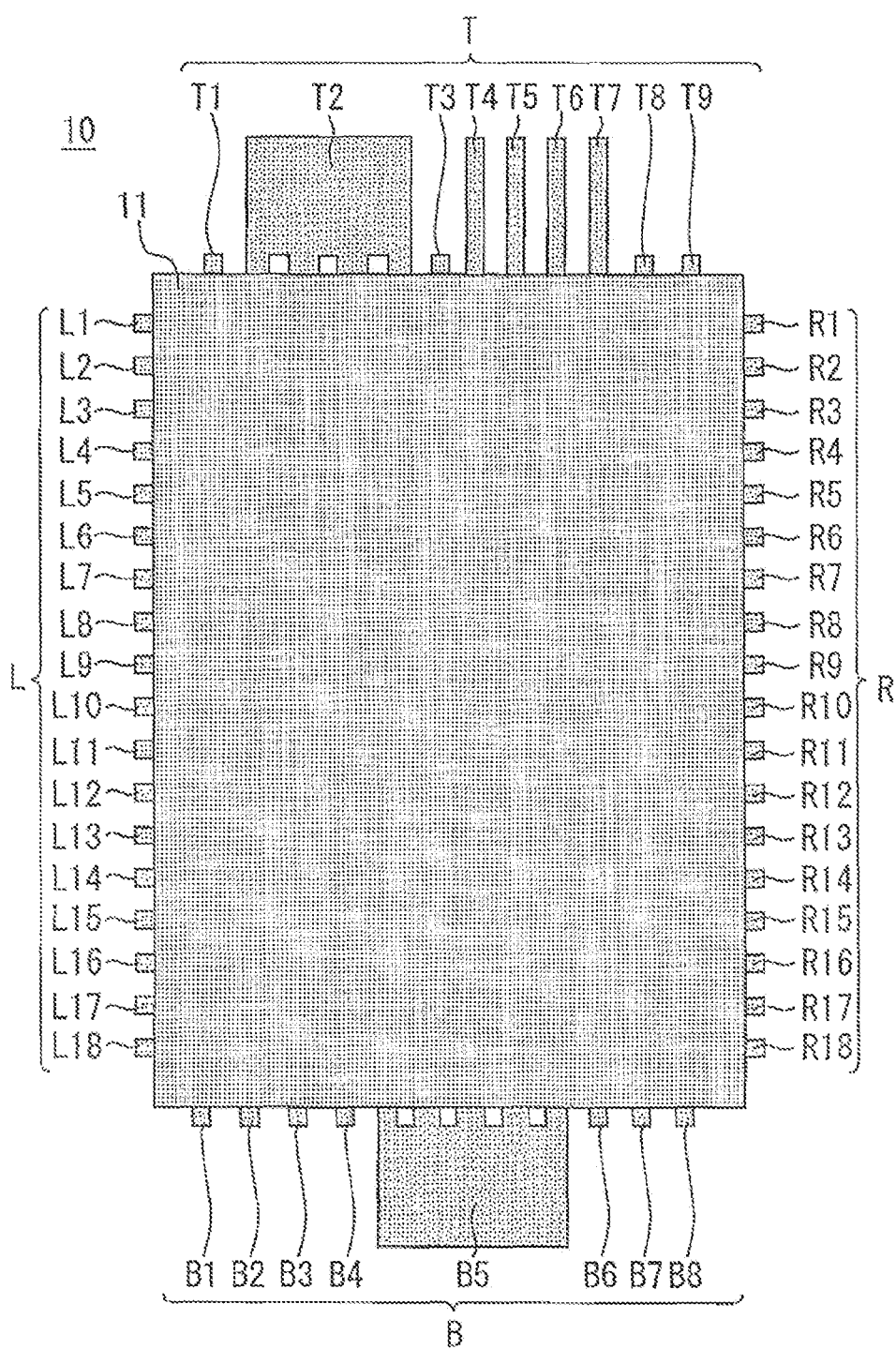
FIG. 1 is a plan view of a semiconductor device according to embodiment 1 of the present invention.

FIG. 1 is a plan view of a semiconductor device 10 according to embodiment 1 of the present invention. The semiconductor device 10 includes a mold resin 11. The mold resin 11 has a rectangular shape in planar view. Terminals T1 to T9 are exposed to an outside from an upper side of the mold resin 11. Terminals R1 to R18 are exposed to the outside from a right side of the mold resin 11. Terminals L1 to L18 are exposed to the outside from a left side of the mold resin 11. Terminals B1 to B8 are exposed to the outside from a lower side of the mold resin 11. In this way, terminals are exposed to the outside from all side surfaces of the mold resin 11.

Figure 2:
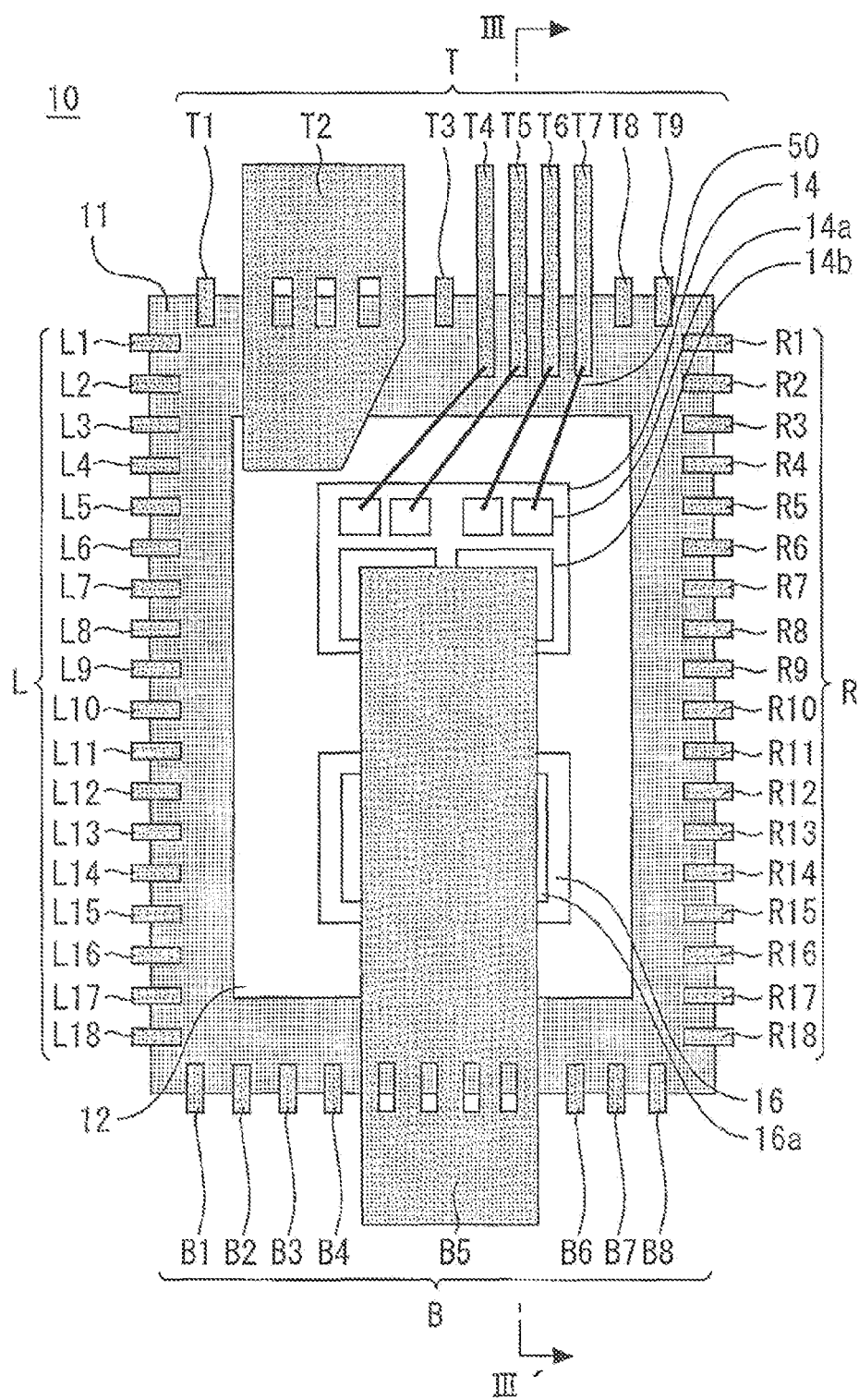
FIG. 2 is a plan view showing the inside of the mold resin of FIG. 1.

FIG. 2 is a plan view showing the inside of the mold resin 11 of FIG. 1. In FIG. 2, part of the mold resin 11 is omitted in order to show the inside of the mold resin 11. In subsequent drawings, part of the mold resin 11 may also be omitted as in FIG. 2. A substrate 12 which functions as a heat sink exists inside the mold resin 11. The substrate 12 is formed of a conductive material such as metal. Semiconductor elements 14 and 16 are fixed to the substrate 12. The semiconductor element 14 is an IGBT chip having gates 14a and emitters 14b on a front surface thereof and having a collector connected to the substrate 12 on a back surface thereof. The semiconductor element 16 is a diode chip having an anode 16a on a front surface thereof and having a cathode connected to the substrate 12 on a back surface thereof. The semiconductor elements 14 and 16 and the substrate 12 are covered with the mold resin 11 and therefore located in a center of the semiconductor device 10.

The terminals T2 and B5 are main terminals through which main currents of the semiconductor elements 14 and 16 are passed. The main terminal T2 is fixed to the substrate 12 with, for example, a solder. The main terminal T2 is connected to the collector of the semiconductor element 14 and the cathode of the semiconductor element 16 through the substrate 12. The main terminal B5 is fixed to the emitters 14b and the anode 16a with, for example, a solder.

The terminals T4, T5, T6, and T7 are signal terminals for transmitting signals for switching the semiconductor element 14 between on and off. The signal terminals T4, T5, T6, and T7 are connected to the gates 14a with metal wires 50.

The terminals T1, T3, T8, T9, R1 to R18, L1 to L18, B1 to B4, and B6 to B8 are dummy terminals which are not electrically connected to the semiconductor elements 14 and 16. The main terminals, the signal terminals, and the dummy terminals are partially exposed to the outside from the mold resin 11. The main terminals T2 and B5 are formed to have larger widths than the signal terminals and the dummy terminals. The main terminal T2 has three openings formed therein. The main terminal B5 has four openings formed therein. The widths of the signal terminals and the dummy terminals are equal.

Figure 3:
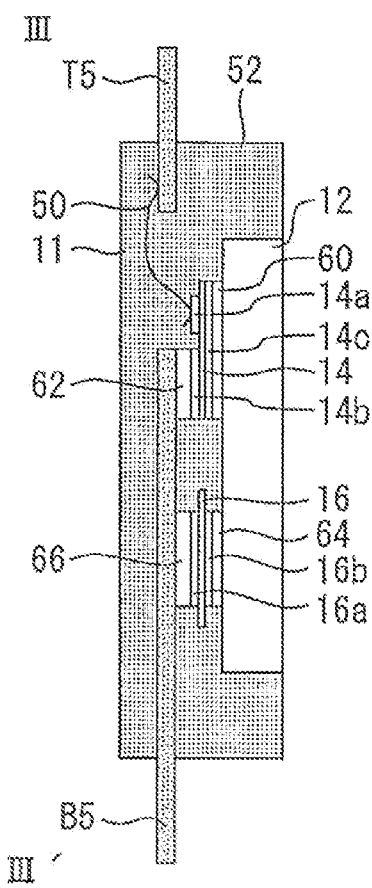
FIG. 3 is a cross-sectional view of the semiconductor device taken along line of FIG. 2.

FIG. 3 is a cross-sectional view of the semiconductor device 10 taken along line of FIG. 2. The collector 14c of the semiconductor element 14 is fixed to the substrate 12 with solder 60. The emitters 14b are fixed to the main terminal B5 with solder 62. The cathode 16b of the semiconductor element 16 is fixed to the substrate 12 with solder 64. The anode 16a is fixed to the main terminal B5 with solder 66. It should be noted that an electrically conductive adhesive may be used instead of a solder to fix these.

Part (back surface) of the substrate 12 is exposed to the outside from the mold resin 11. It should be noted that a ceramic substrate may be provided between the substrate 12 and the semiconductor element 14 and between the substrate 12 and the semiconductor element 16.

Figure 4:
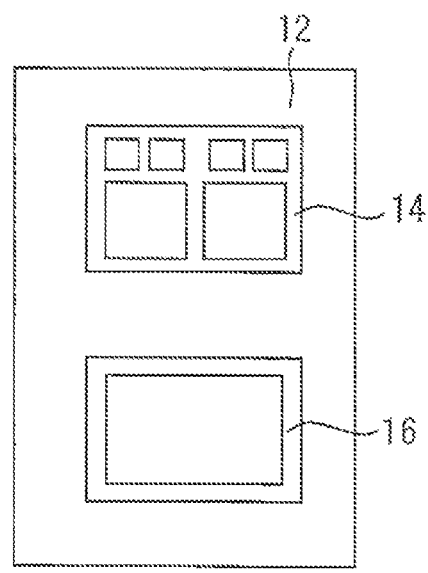
FIG. 4 is a plan view showing that the semiconductor elements have been fixed to the substrate.
Figure 5:
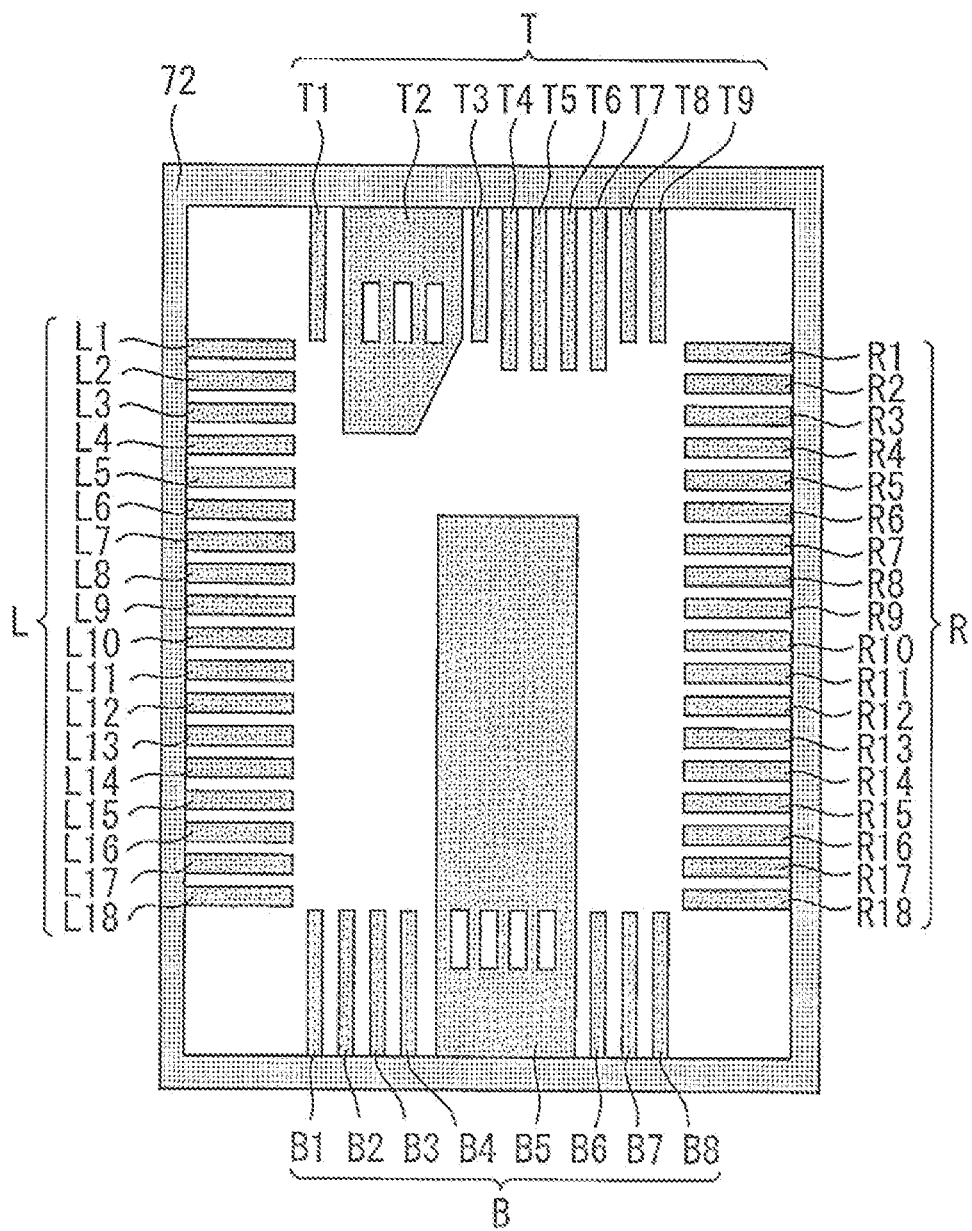
FIG. 5 is a plan view of a terminal aggregate.

A method of manufacturing the semiconductor device 10 according to embodiment 1 of the present invention will be described. First, the semiconductor elements 14 and 16 are fixed to the substrate 12 using a solder. FIG. 4 is a plan view showing that the semiconductor elements 14 and 16 have been fixed to the substrate 12. Then, a terminal aggregate is fixed to the substrate 12 and the semiconductor elements 14 and 16. FIG. 5 is a plan view of a terminal aggregate 70. The terminal aggregate 70 includes a frame portion 72. The main terminals T2 and B5, the signal terminals T4 to T7, and the dummy terminals T1, T3, T8, T9, R1 to R18, L1 to L18, B1 to B4, and B6 to B8 are connected to the inside of the frame portion 72.

Figure 6:
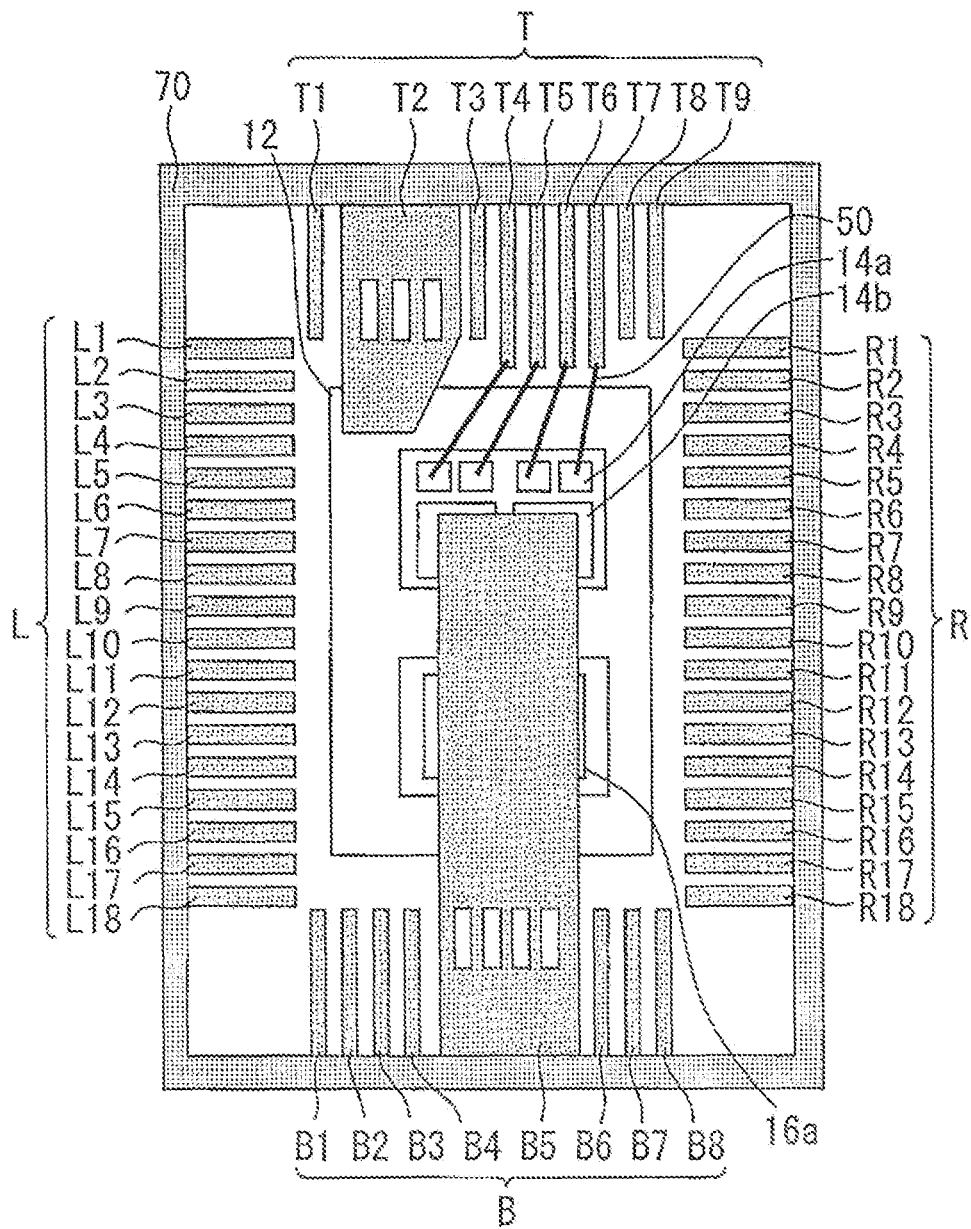
FIG. 6 is a plan view showing that the terminal aggregate has been fixed to the substrate and the semiconductor elements.

FIG. 6 is a plan view showing that the terminal aggregate 70 has been fixed to the substrate 12 and the semiconductor elements 14 and 16. In this step, the signal terminals T4 to T7 are connected to the gates 14a with the metal wires 50. Further, with a solder, the main terminal T2 is connected to the substrate 12, and the main terminal B5 is connected to the emitters 14b and the anode 16a. The signal terminals T4 to T7 and the main terminals T2 and B5 are electrically connected to the semiconductor elements 14 and 16 in this way to form a to-be-encapsulated body 74 in which the substrate 12, the semiconductor elements 14 and 16, and the terminal aggregate 70 are integrated.

Figure 7:
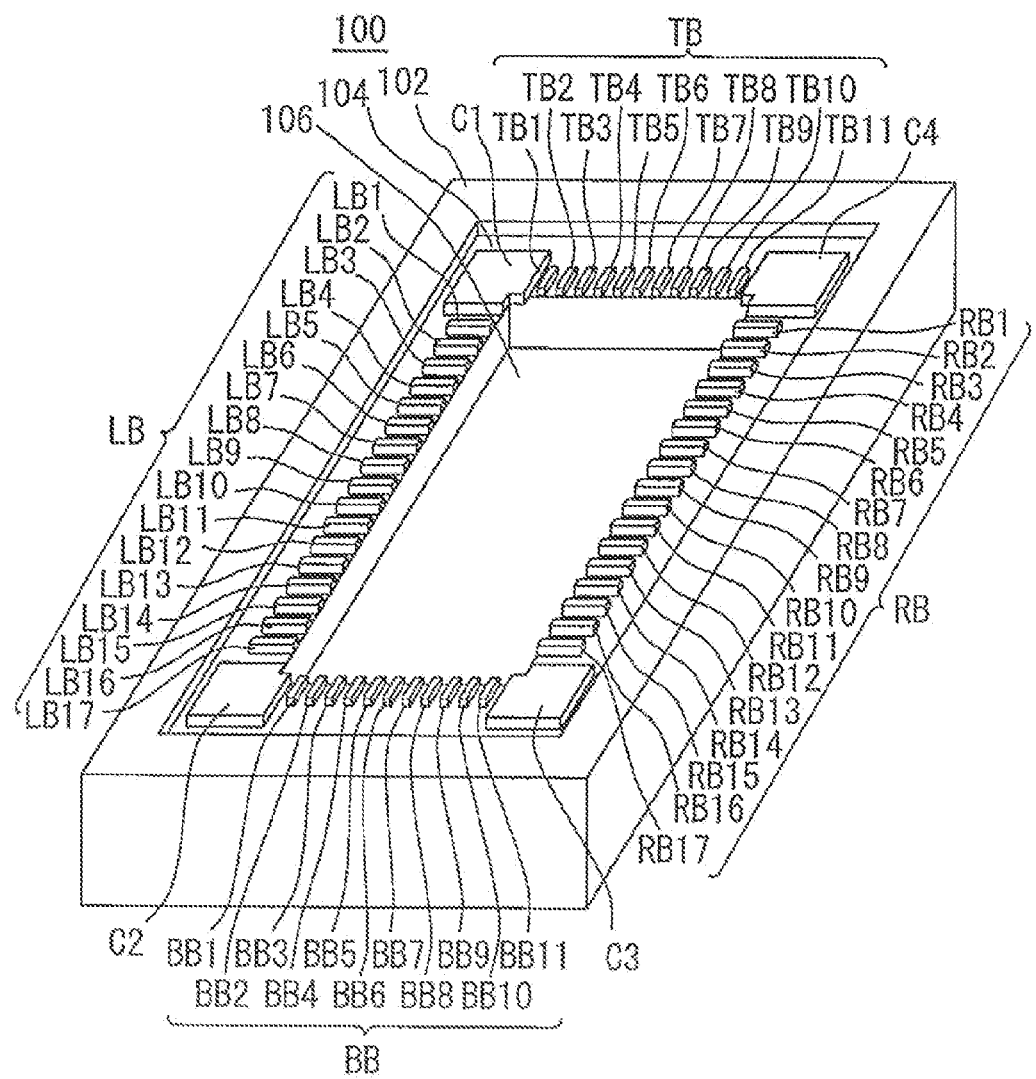
FIG. 7 is a perspective view of a lower mold half.

Next, a lower mold half will be described. FIG. 7 is a perspective view of a lower mold half 100. The lower mold half 100 has a first surface 102, a second surface 104 which is a surface one-step lower than the first surface 102, and a third surface 106 which is a surface one-step lower than the second surface 104. The second surface 104 is formed to surround the third surface 106. The first surface 102 is formed to surround the second surface 104.

The boundary between the second surface 104 and the third surface 106 is a rectangle in planar view. A plurality of blocks are formed along the boundary on the second surface 104. Specifically, the second surface 104 has blocks TB1 to TB11, blocks RB1 to RB17, blocks LB1 to LB17, and blocks BB1 to BB11 respectively formed thereon along sides of the rectangle of the boundary between the second surface 104 and the third surface 106. Moreover, blocks CB1 to CB4 are formed to be adjacent to corners of the rectangular boundary. All inter-block spaces (inter-block space means a space between a block and another block adjacent to the foregoing block) are equal.

The blocks TB1 to TB11, the blocks RB1 to RB17, the blocks LB1 to LB17, the blocks BB1 to BB11, and the blocks CB1 to CB4 may be collectively referred to as a "plurality of blocks." Top surfaces of the plurality of blocks and the first surface 102 are surfaces at the same height.

Figure 8:
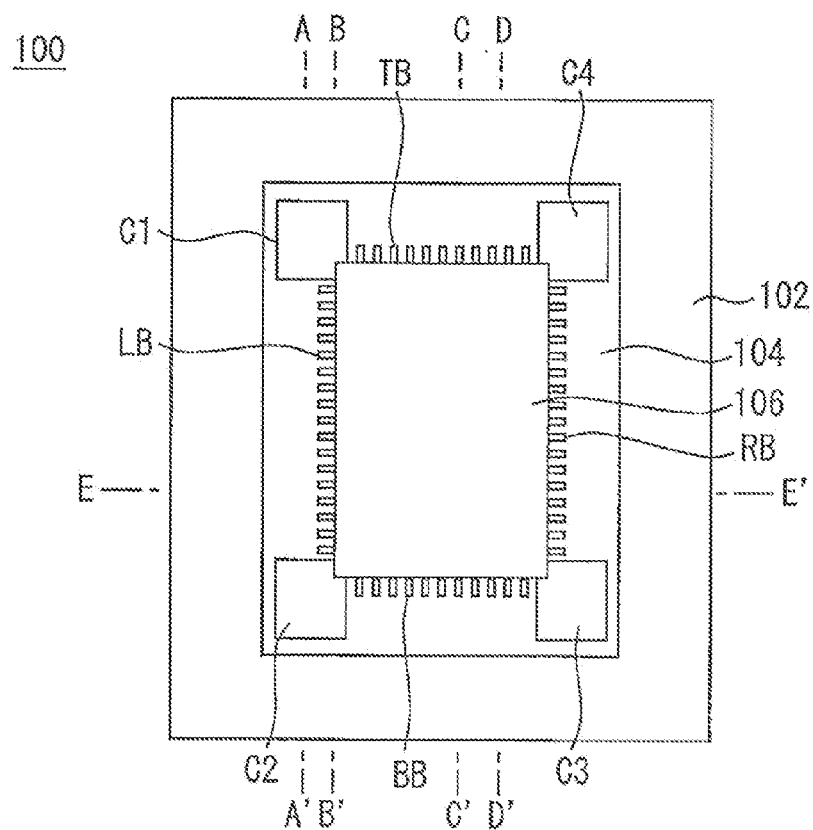
FIG. 8 is a plan view of the lower mold half.
Figure 9:
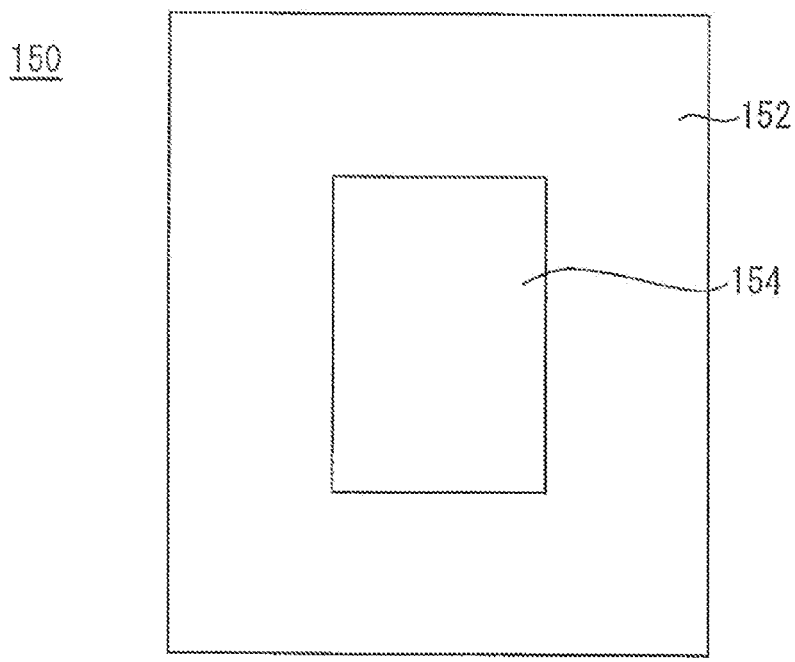
FIG. 9 is a plan view of an upper mold half.

FIG. 8 is a plan view of the lower mold half 100. FIG. 9 is a plan view of an upper mold half 150. The upper mold half 150 has a first surface 152 and a second surface 154 which is a surface one-step lower than the first surface 152. The shape and the area of the second surface 154 are equal to those of the third surface 106 of the lower mold half 100.

FIG. 10 includes cross-sectional views showing the lower mold half 100 and the upper mold half 150 placed on top of each other and clamped together. FIG. 10A is a cross-sectional view taken along line A-A' of FIG. 8. There is a gap between the second surface 104 of the lower mold half 100 and the upper mold half 150. FIG. 10B is a cross-sectional view taken along line B-B' of FIG. 8. Since there are the blocks C1, LB, and C2, gaps 160 in the form of comb tooth are formed between the lower mold half 100 and the upper mold half 150.

FIG. 10C is a cross-sectional view taken along line C-C' of FIG. 8. Line C-C' is a line passing through blocks. A cavity 170 is formed between the third surface 106 of the lower mold half 100 and the second surface 154 of the upper mold half 150. FIG. 10D is a cross-sectional view taken along line D-D' of FIG. 8. Line D-D' is a line not passing through blocks. Inter-block spaces 162 are continuous with the cavity 170 between the third surface 106 of the lower mold half 100 and the second surface 154 of the upper mold half 150.

FIG. 11 is a cross-sectional view taken along line E-E' of FIG. 8. Line E-E' is a line not passing through blocks. Inter-block spaces 164 are continuous with the cavity 170 between the third surface 106 of the lower mold half 100 and the second surface 154 of the upper mold half 150. It should be noted that in FIGS. 10 and 11, the lower mold half 100 and the upper mold half 150 are hatched for convenience of explanation.

Figure 12:
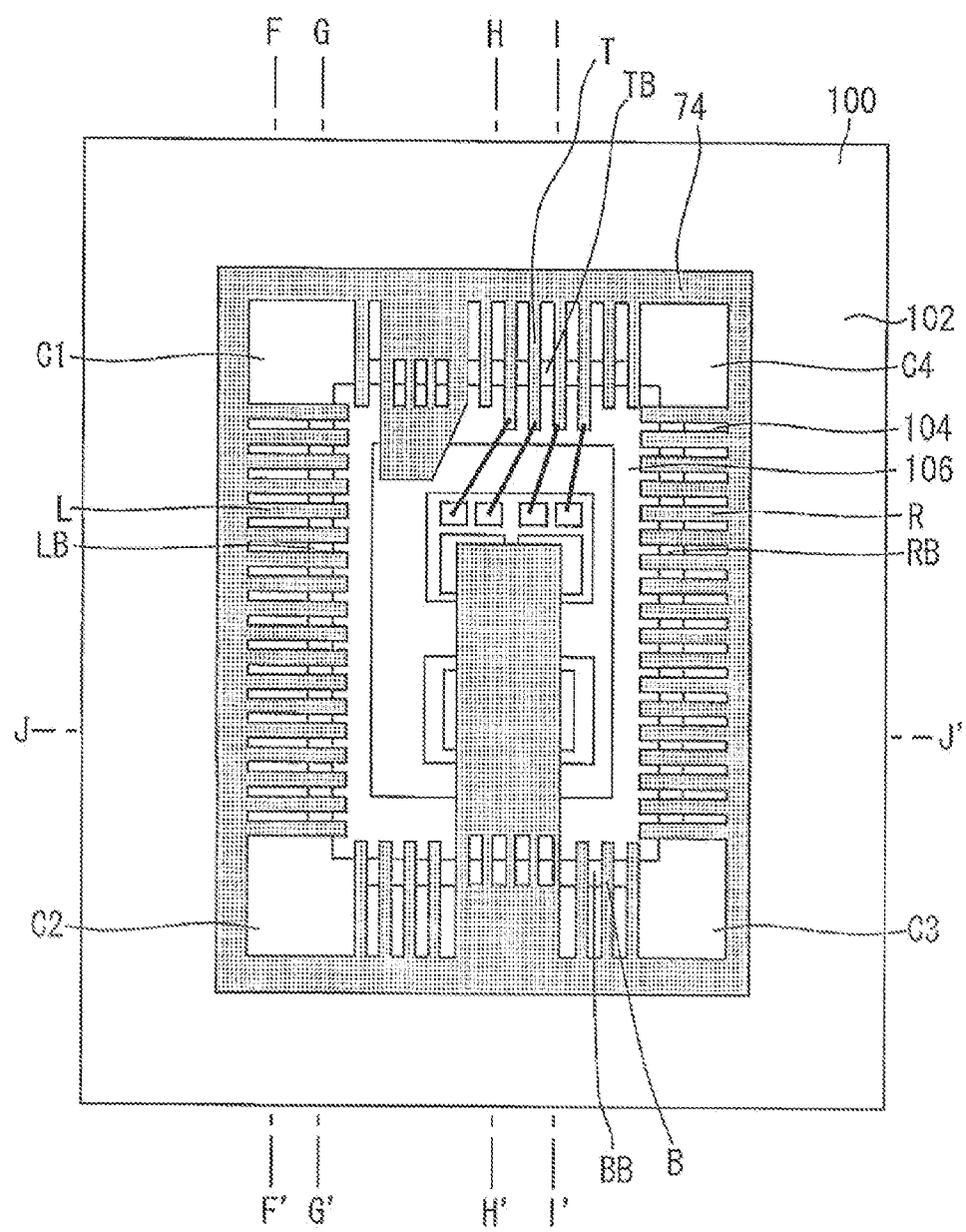
FIG. 12 is a plan view showing that the to-be-encapsulated body has been mounted on the lower mold half.
Figure 13:
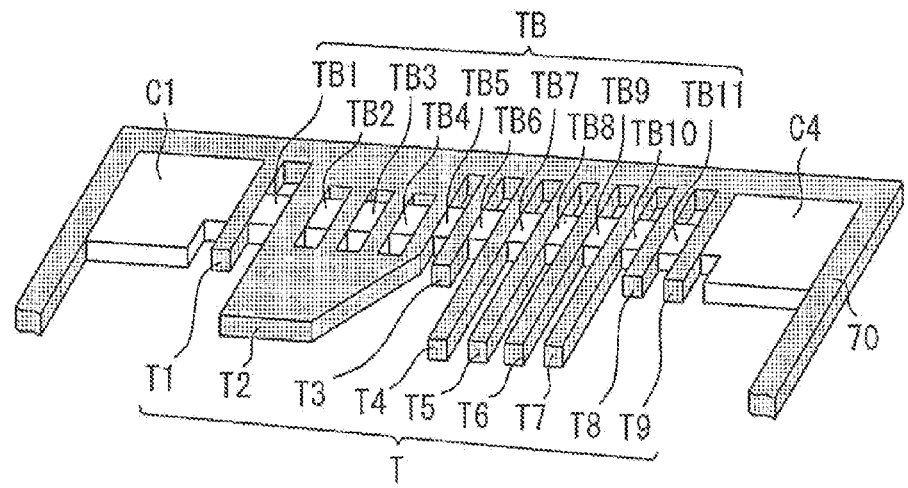
FIG. 13 is an enlarged perspective view showing the part of FIG. 12.

The to-be-encapsulated body 74 is mounted on the above-described lower mold half 100. This step is referred to as a mounting step. FIG. 12 is a plan view showing that the to-be-encapsulated body 74 has been mounted on the lower mold half 100. In the mounting step, the to-be-encapsulated body 74 is mounted on the lower mold half 100 to mesh a plurality of blocks formed in the lower mold half 100 with the main terminals, the signal terminals, and the dummy terminals with no space left therebetween. FIG. 13 is an enlarged perspective view showing the blocks TB, C1, and C4 and the terminals T of FIG. 12. The three blocks TB2 to TB4 are placed in the three openings of the main terminal T2.

In this way, every inter-block space of the lower mold half 100 is filled with a main terminal, a signal terminal, or a dummy terminal of the terminal aggregate 70. For example, eight out of the 12 inter-block spaces formed by the blocks C1, TB, and C4 are filled with the terminals T1 and T3 to T9, and four are filled with the main terminal T2. The reason why the main terminal T2 can fill four inter-block spaces is that the blocks TB2 to TB4 are placed in the three openings of the main terminal T2.

The 18 inter-block spaces formed by the blocks C4, RB, and C3 are filled with the terminals R1 to R18. The 18 inter-block spaces formed by the blocks C1, LB, and C2 are filled with the terminals L1 to L18. Seven out of the 12 inter-block spaces formed by the blocks C2, B, and C3 are filled with the terminals B1 to B4 and B6 to B8, and five are filled with the terminal B5. The reason why the main terminal B5 can fill five inter-block spaces is that the blocks BB5 to BB8 are placed in the four openings of the main terminal B5.

After the mounting step, top surfaces of the main terminals, the signal terminals, and the dummy terminals, top surfaces of the plurality of blocks, and the first surface 102 become surfaces at the same height. The top surfaces of the main terminals, the signal terminals, and the dummy terminals, the top surfaces of the plurality of blocks, and the first surface 102 are generically referred to as contact surfaces.

Figure 14:
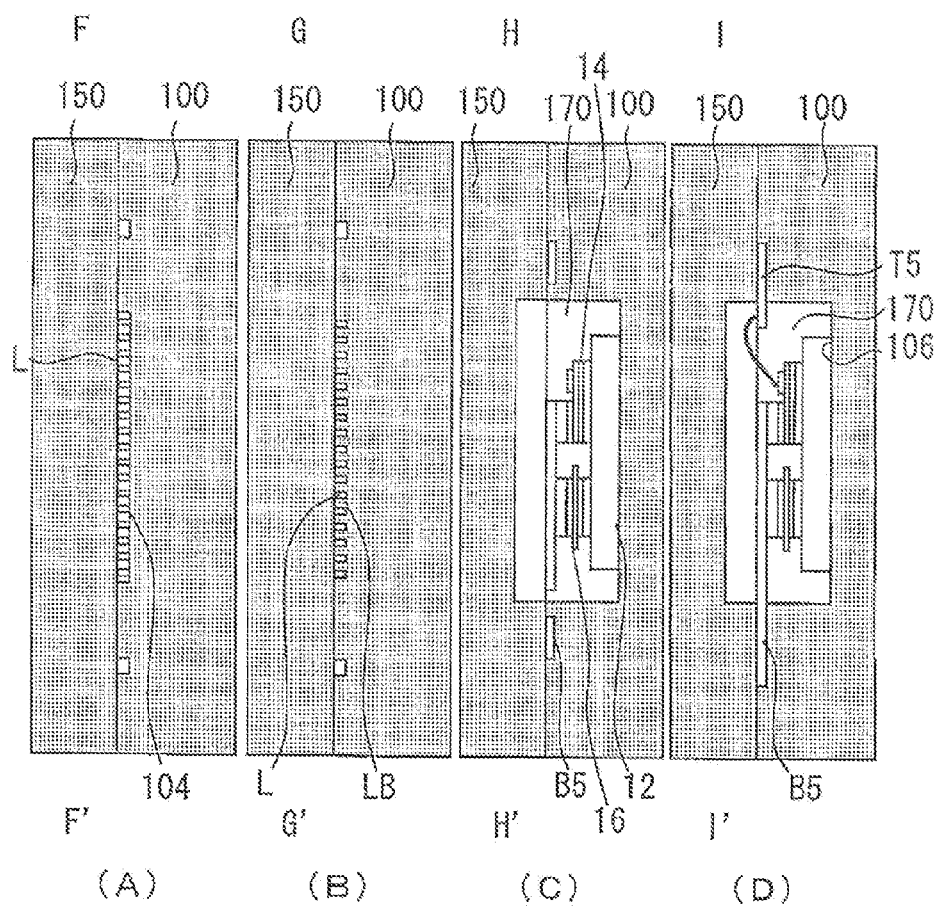
FIG. 14A is a cross-sectional view taken along line F-F' of FIG. 12.
FIG. 14B is a cross-sectional view taken along line G-G' of FIG. 12.
FIG. 14C is a cross-sectional view taken along line H-H' of FIG. 12.
FIG. 14D is a cross-sectional view taken along line I-I' of FIG. 12.

Subsequently, the lower mold half 100 and the upper mold half 150 are clamped together. This step is referred to as a mold clamping step. In the mold clamping step, the first surface 152 of the upper mold half 150 is brought into contact with the contact surfaces. FIG. 14 is a cross-sectional view showing the to-be-encapsulated body 74, the lower mold half 100, and the upper mold half 150 after mold clamping. FIG. 14A is a cross-sectional view taken along line F-F' of FIG. 12. The terminals L are in the gaps between the second surface 104 of the lower mold half 100 and the upper mold half 150. FIG. 14B is a cross-sectional view taken along line G-G' of FIG. 12. Line G-G' is a line passing through the blocks LB. The inter-block spaces are filled with the terminals L.

FIG. 14C is a cross-sectional view taken along line H-H' of FIG. 12. Line H-H' is a line passing through blocks. The substrate 12, the semiconductor elements 14 and 16, and the like are placed in the cavity 170. FIG. 14D is a cross-sectional view taken along line I-I' of FIG. 12. Line I-I' is a line not passing through blocks. The inter-block spaces (inter-block spaces 162 in FIG. 10D) are filled with the terminals T5 and B5.

Figure 15:
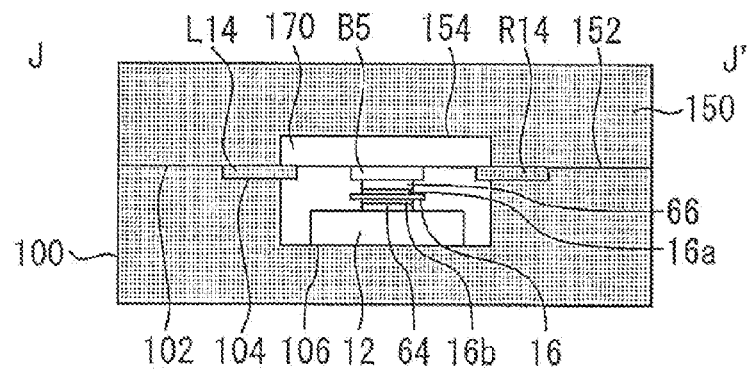
FIG. 15 is a cross-sectional view taken along line J-J' of FIG. 12.

FIG. 15 is a cross-sectional view taken along line J-J' of FIG. 12. Line J-J' is a line not passing through blocks. The inter-block spaces (inter-block spaces 164 in FIG. 11) are filled with the terminals L14 and R14. In the mold clamping step, a bottom surface (first surface 152) of the upper mold half 150 is placed on the top surfaces of the plurality of blocks, the top surfaces of the main terminals, the top surfaces of the signal terminals, and the top surfaces of the dummy terminals with no space left therebetween to form the cavity 170.

Figure 16:
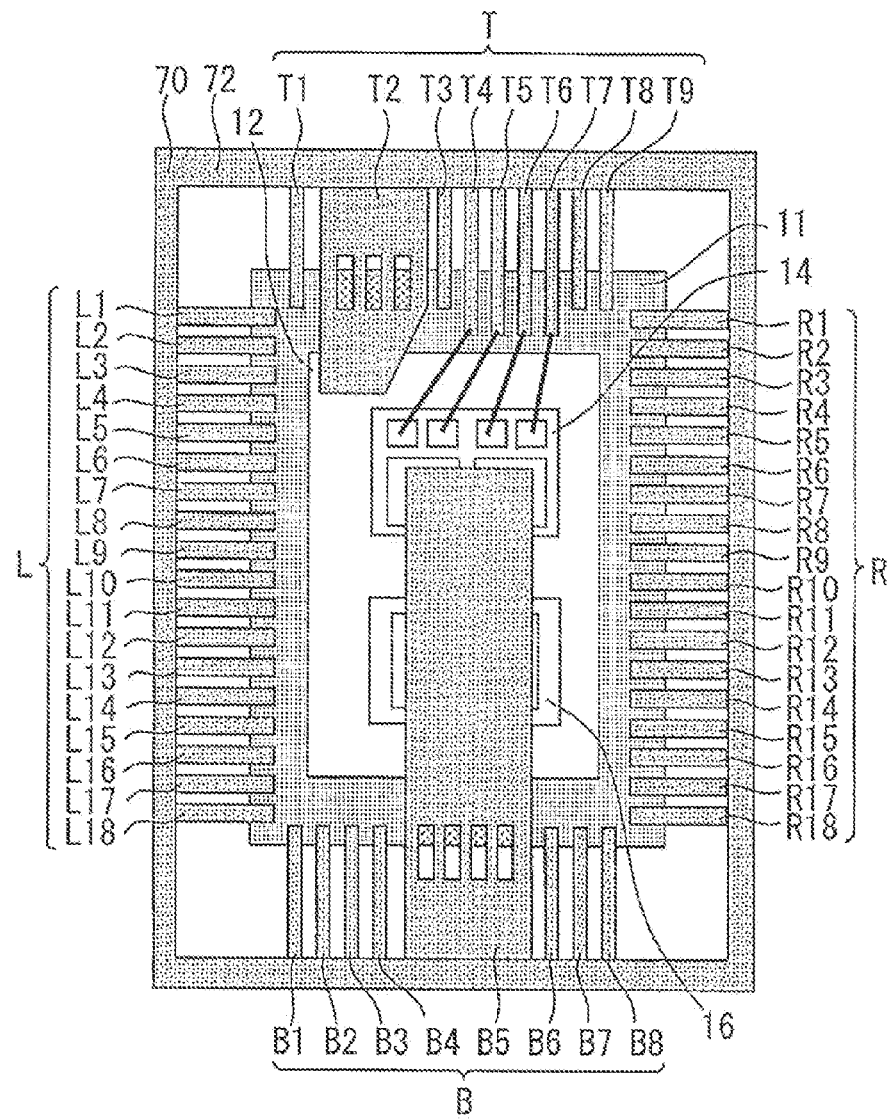
FIG. 16 is a plan view of the to-be-encapsulated body encapsulated in the mold resin.

Subsequently, mold resin is injected into the cavity 170. This step is referred to as a molding step. After the molding step, the to-be-encapsulated body 74 encapsulated in mold resin is taken out of the mold. FIG. 16 is a plan view of the to-be-encapsulated body 74 encapsulated in the mold resin 11. In FIG. 16, part of the mold resin 11 is omitted so that the inside of the mold resin 11 can be seen. Every terminal includes a portion covered with the mold resin 11 and a portion extending outside the mold resin 11.

Figure 17:
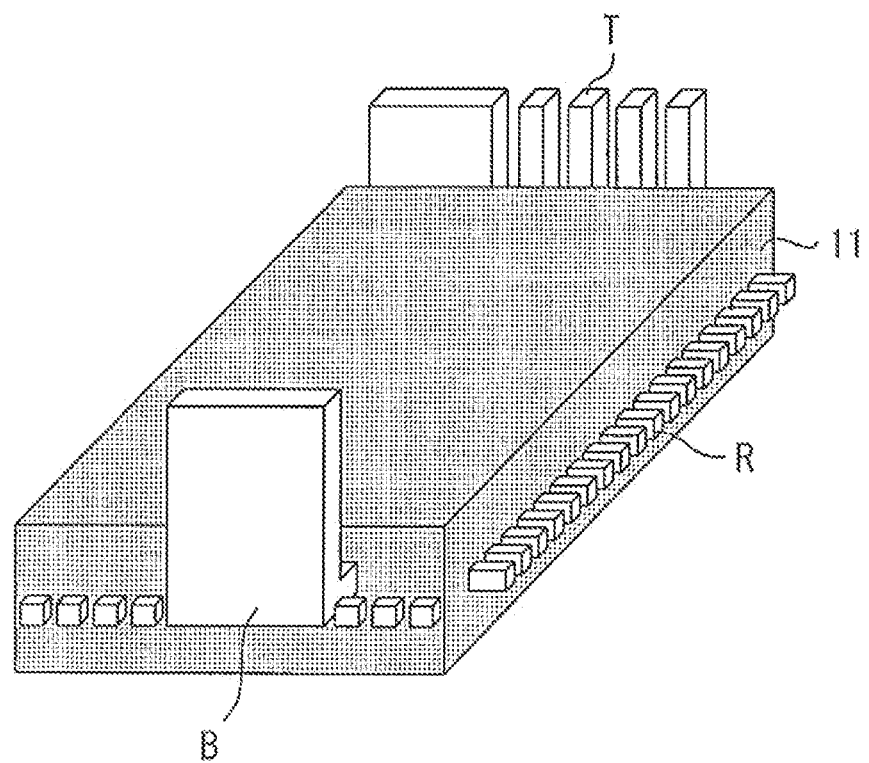
FIG. 17 is perspective view of semiconductor device whose terminal is bent.

Subsequently, the frame portion is cut off from the main terminals, the signal terminals, and the dummy terminals. This step is referred to as a cutting-off step. The semiconductor device 10 shown in FIGS. 1 and 2 is completed by cutting the frame portion 72 of FIG. 16 off. It should be noted that terminals may be appropriately bent as shown in FIG. 17.

Figure 18:
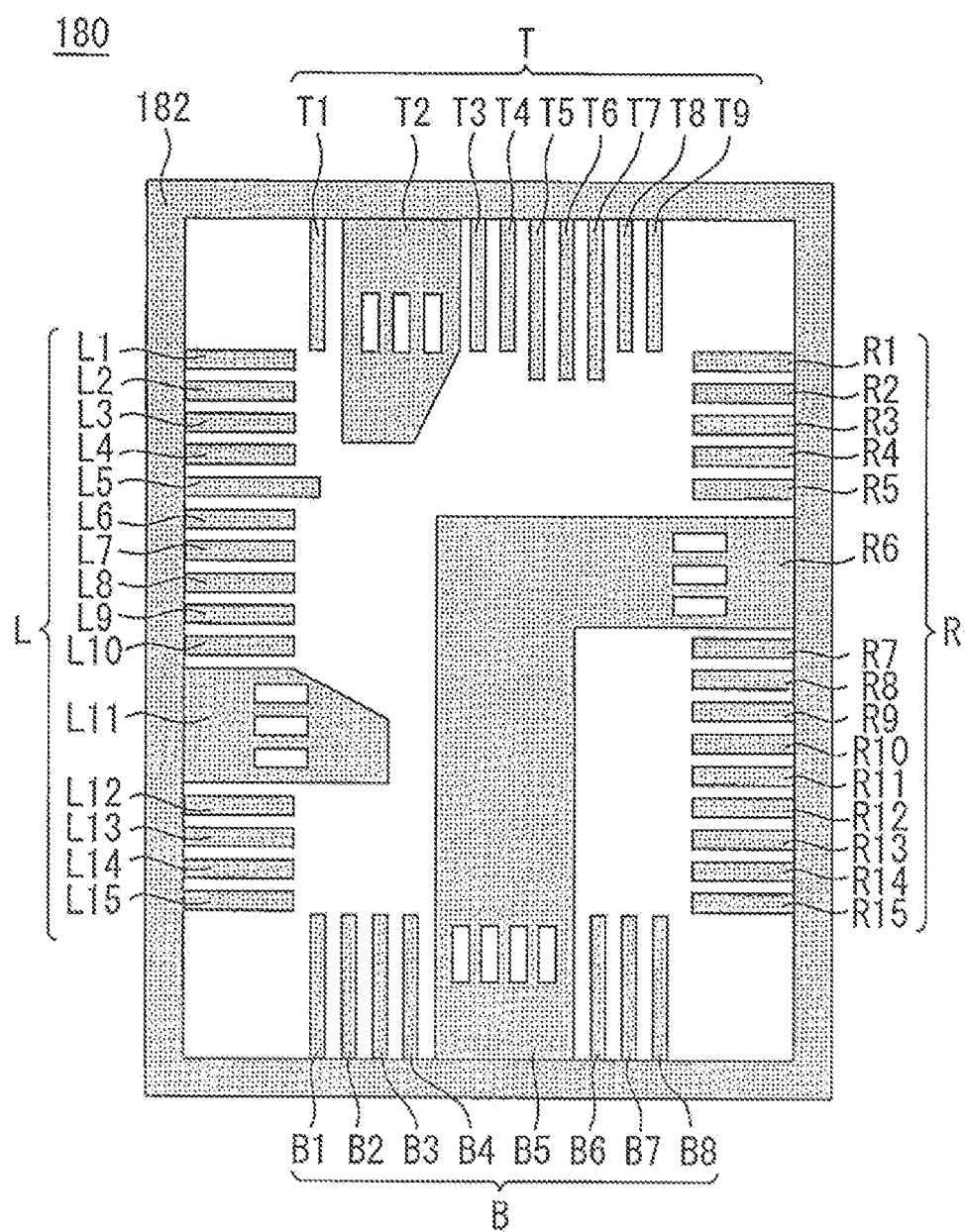
FIG. 18 is a plan view showing a terminal aggregate.

The present invention makes it possible to perform resin encapsulation on a plurality of semiconductor device products having different terminal arrangements using a single mold (including the lower mold half 100 and the upper mold half 150). The encapsulation of a semiconductor device having a terminal arrangement different from that of the semiconductor device 10 in resin using the lower mold half 100 and the upper mold half 150 will be described. FIG. 18 is a plan view showing a terminal aggregate 180 having a terminal arrangement different from that of the terminal aggregate 70 of FIG. 5. Terminals T, R, L, and B are connected to the inside of a frame portion 182.

The terminals T2, R6, L11, and B5 are main terminals. The main terminal T2 has three openings formed therein. The main terminal R6 has three openings formed therein. The main terminal B5 has four openings formed therein. The main terminal R6 and the main terminal B5 are connected to constitute a single main terminal. The main terminal L11 has three openings formed therein. The terminals T5 to T7 and L5 are signal terminals. The other terminals are dummy terminals.

Figure 19:
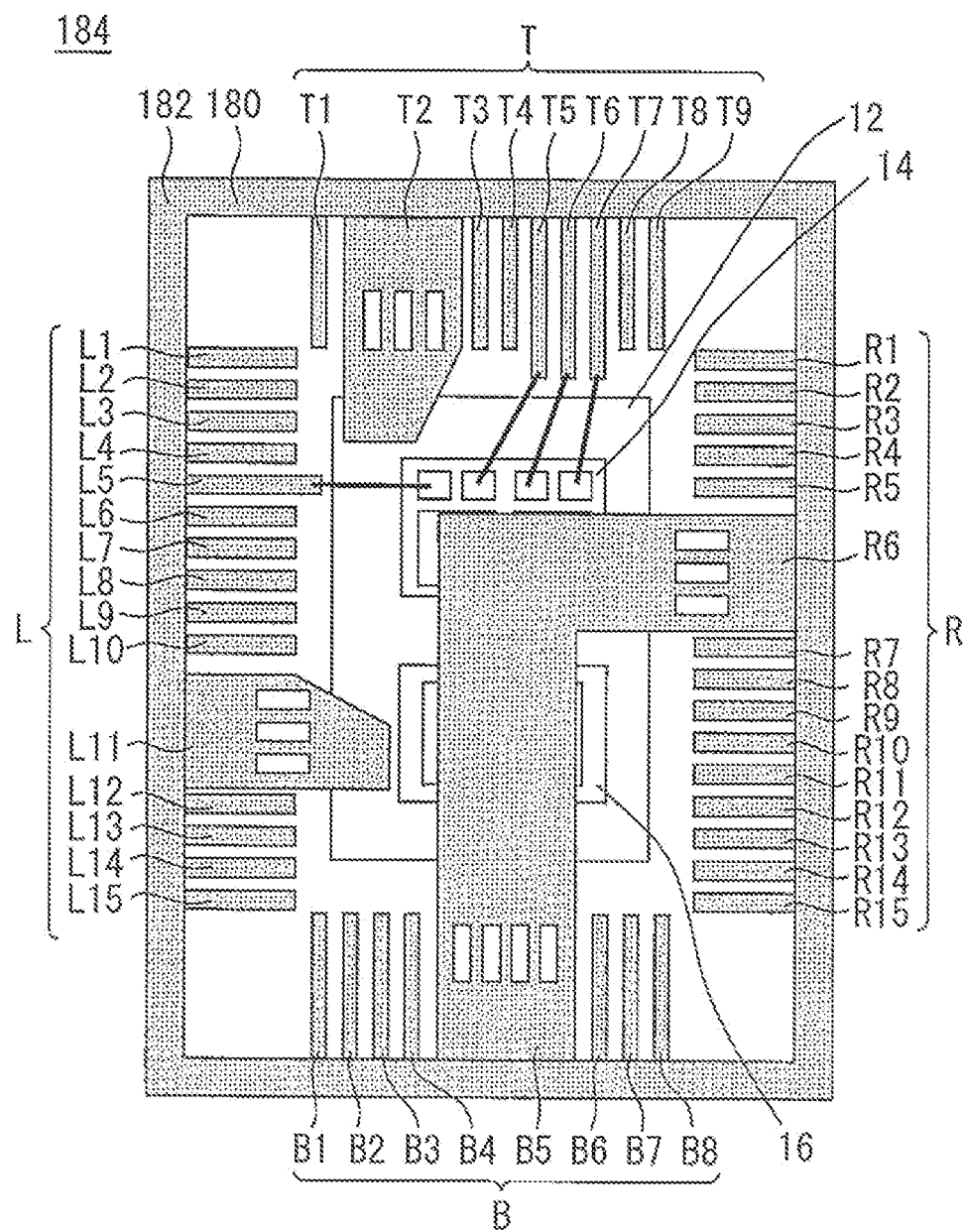
FIG. 19 is a plan view showing that the terminal aggregate has been fixed to the substrate and the semiconductor elements.

FIG. 19 is a plan view showing that the terminal aggregate 180 has been fixed to the substrate 12 and the semiconductor elements 14 and 16. The to-be-encapsulated body 184 is completed by fixing the terminal aggregate 180 to the semiconductor elements 14 and 16. After that, the mounting step is carried out. In the mounting step, the to-be-encapsulated body 184 is mounted on the lower mold half 100 to mesh the plurality of blocks formed in the lower mold half 100 with the main terminals, the signal terminals, and the dummy terminals with no space left therebetween.

Figure 20:
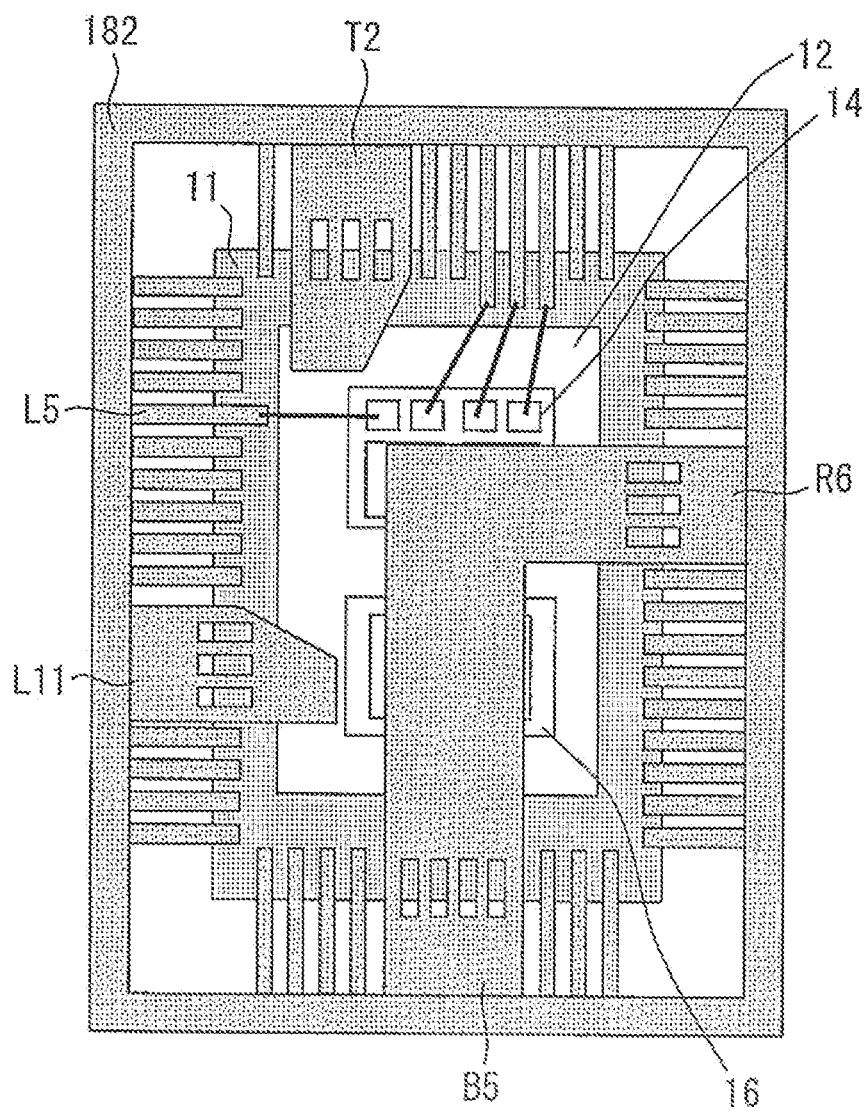
FIG. 20 is a plan view of the to-be-encapsulated body encapsulated in the mold.
Figure 21:
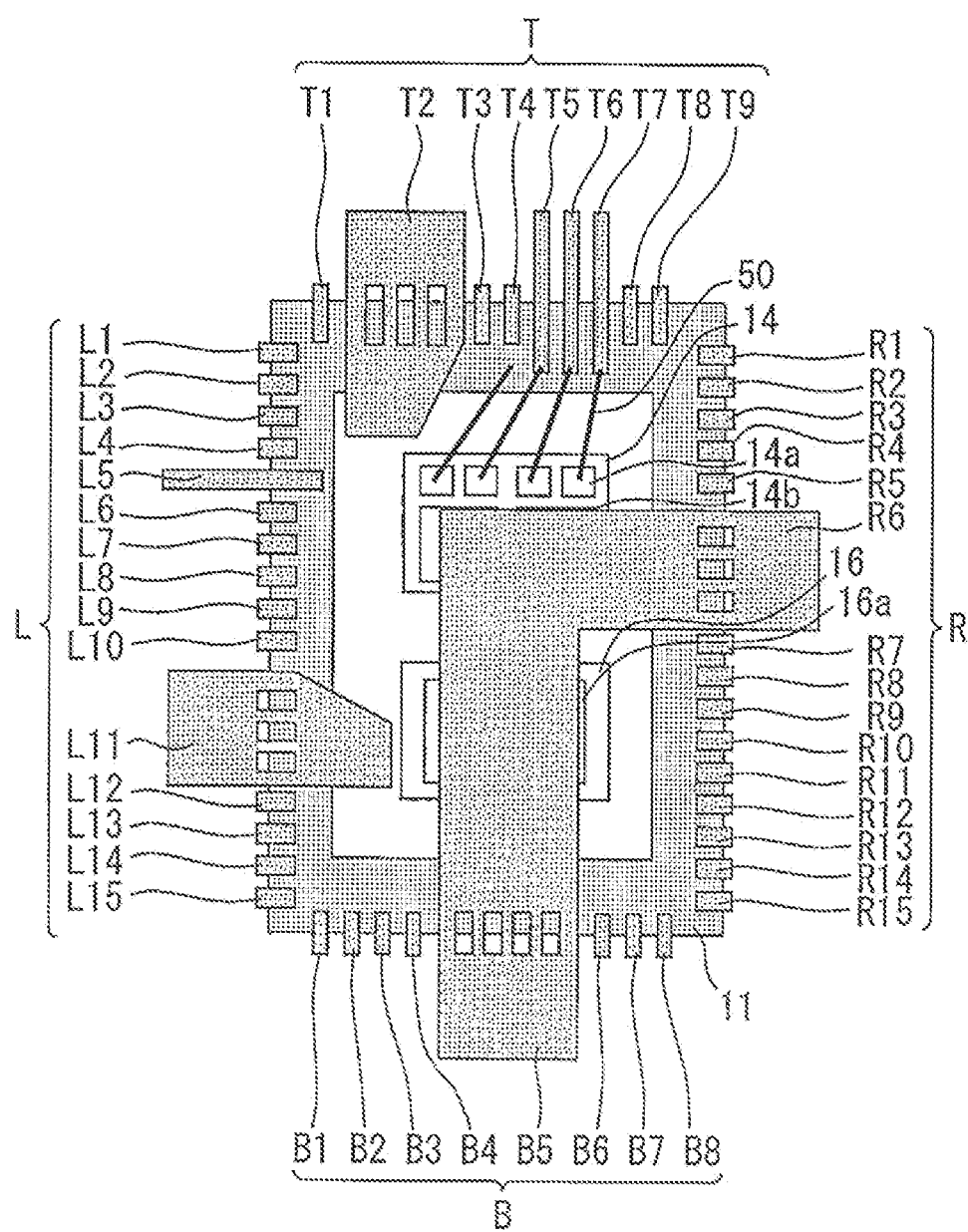
FIG. 21 is a plan view of the semiconductor device after cutting-off step.

In this way, every inter-block space of the lower mold half 100 is filled with a main terminal, a signal terminal, or a dummy terminal of the terminal aggregate 180. After that, the mold clamping step and the molding step are carried out to obtain a structure shown in FIG. 20. Finally, the cutting-off step is carried out to complete a semiconductor device of FIG. 21.

The arrangements of main terminals and signal terminals are different between the terminal aggregate 70 of FIG. 5 and the terminal aggregate 180 of FIG. 18. However, the terminal arrangements of the terminal aggregate 70 and the terminal aggregate 180 are made equal to each other by forming dummy terminals in the terminal aggregates 70 and 180. Accordingly, these can be mounted on the same lower mold half 100.

Of course, a terminal aggregate having main terminals and signal terminals at positions different from those of the terminal aggregates 70 and 180 can also be mounted on the lower mold half 100 by adding dummy terminals such that terminals fill all the inter-block spaces of the lower mold half 100. Accordingly, resin encapsulation can be performed on a plurality of semiconductor device products using a single mold only by changing the terminal arrangement of a terminal aggregate.

Figure 22:
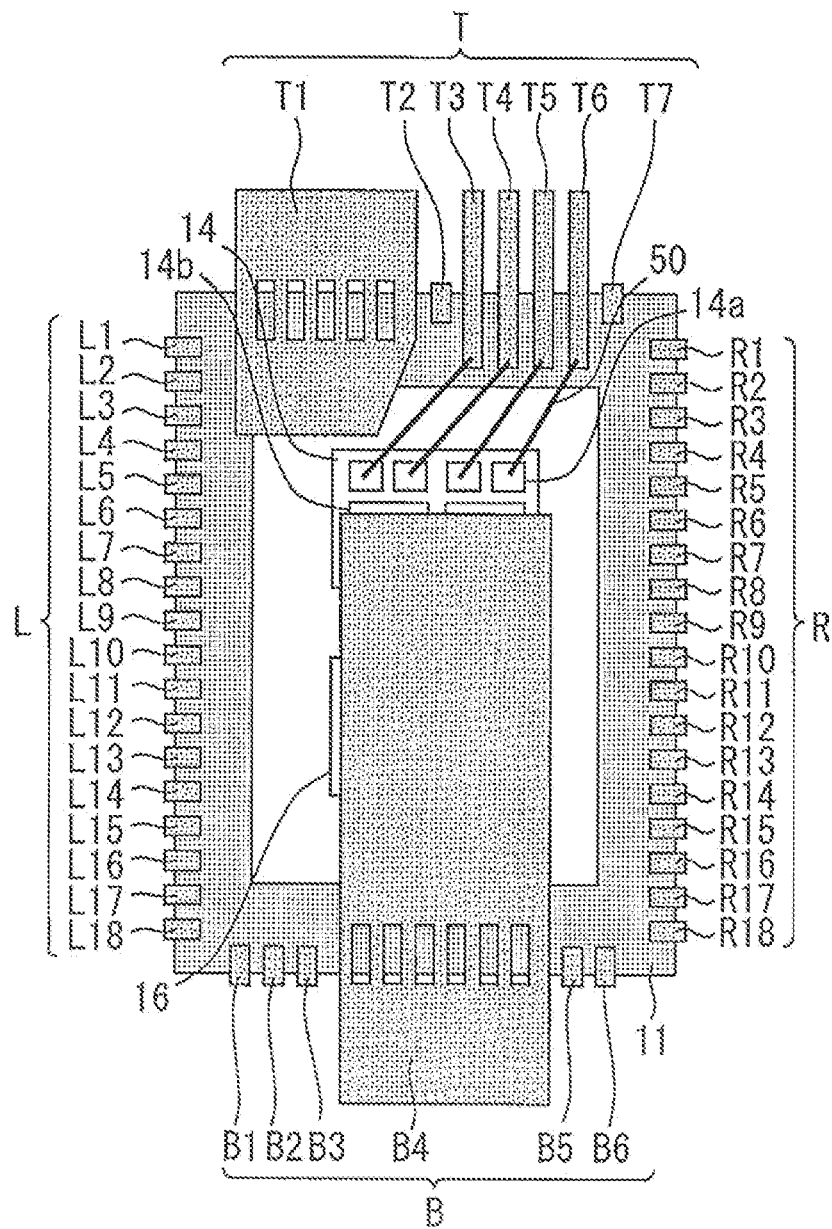
FIG. 22 is a plan view of the semiconductor device.

For example, a semiconductor device shown in FIG. 22 is a semiconductor device encapsulated in resin using the lower mold half 100 and the upper mold half 150. A main terminal T1 having five openings fill six inter-block spaces in the mounting step. Meanwhile, a main terminal B4 having six openings fill seven inter-block spaces in the mounting step. Increasing the widths of the main terminals in this way can reduce the current densities in the main terminals.

Each main terminal according to embodiment 1 of the present invention has openings, and at least one of the plurality of blocks is placed in the openings in the mounting step. Forming openings in main terminals makes it possible to increase the widths of the main terminals while sharing a mold among a plurality of products. This makes it possible to manufacture, for example, a semiconductor device in which main currents of not less than several tens to several hundreds of amperes are passed through main terminals. Further, a terminal arrangement can be changed as desired as long as main terminals, signal terminals, and dummy terminals are provided so as to fill all the inter-block spaces.

Figure 23:
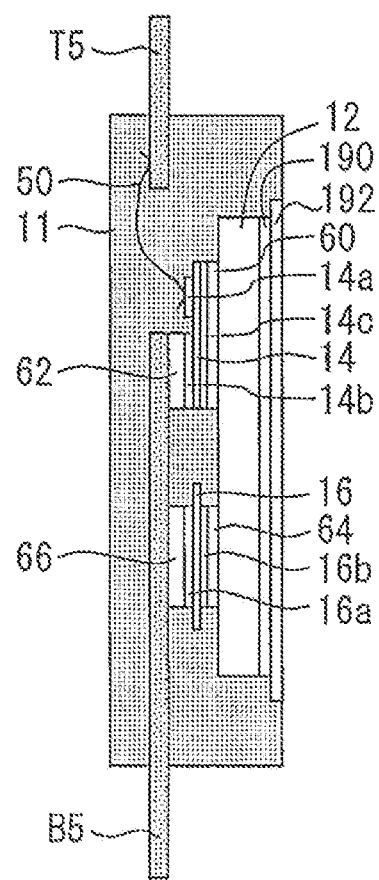
FIG. 23 is a cross-sectional view of the semiconductor device according to modified example.
Figure 24:
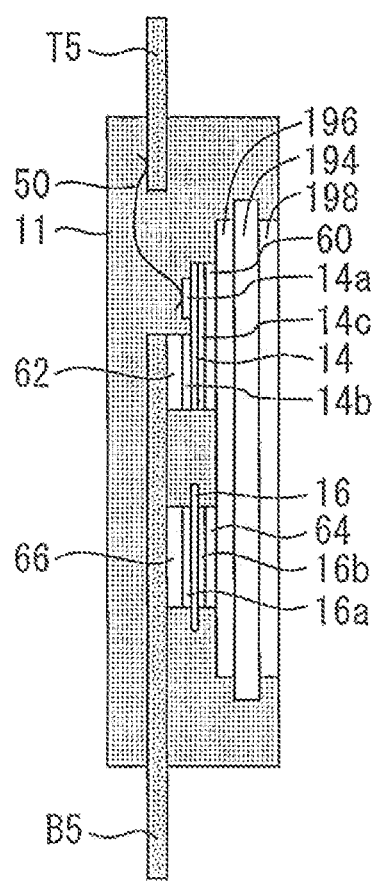
FIG. 24 is a cross-sectional view of the semiconductor device according to another modified example.

Various modifications can be made to the semiconductor device manufacturing method and the semiconductor device according to embodiment 1 of the present invention without departing from the scope of the present invention. For example, various modifications can be made to the structures on the back surface sides of the semiconductor elements 14 and 16. FIGS. 23 and 24 are cross-sectional views of semiconductor devices according to modified examples. FIG. 23 discloses a semiconductor device in which a metal film 192 is formed on the back surface of the substrate 12 with an insulating sheet 190 interposed therebetween. FIG. 24 discloses a semiconductor device in which metal films 196 and 198 are formed on both surfaces of an insulating substrate 194. Although an IGBT chip and a diode chip are used as semiconductor elements in embodiment 1 of the present invention, a semiconductor element, e.g., a MOSFET chip or the like, may be used. It should be noted that these modifications can also be applied to semiconductor device manufacturing methods and semiconductor devices according to the following embodiments.

The description of semiconductor device manufacturing methods and semiconductor devices according to the following embodiments focuses on differences from embodiment 1.

Embodiment 2

Figure 25:
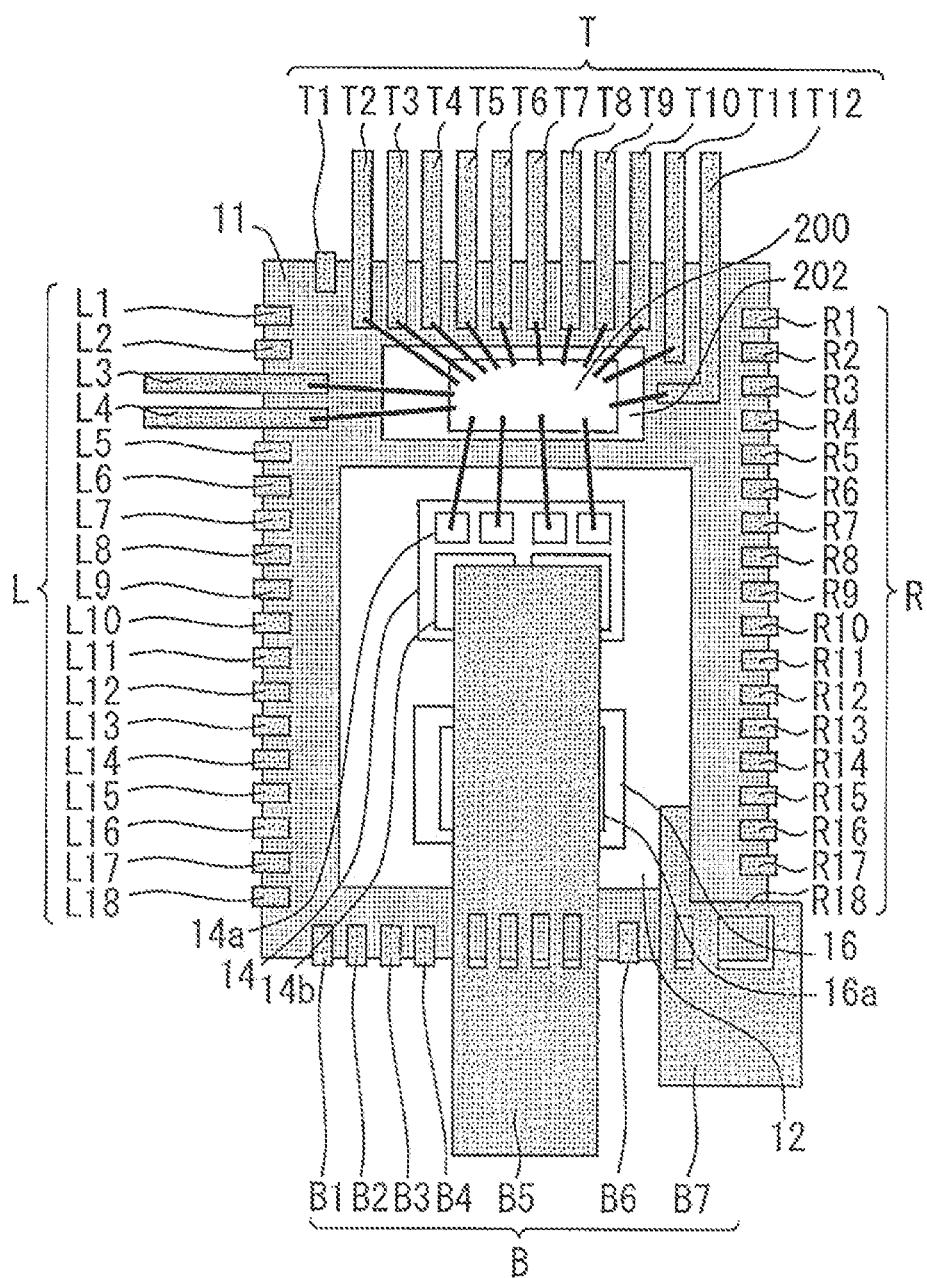
FIG. 25 is a plan view of the semiconductor device according to embodiment 2 of the present invention.

FIG. 25 is a plan view showing the inside of the mold resin 11 of a semiconductor device according to embodiment 2 of the present invention. A control IC 200 for controlling the semiconductor element 14 is formed inside the mold resin 11. The control IC 200 is fixed to a substrate 202. Signal terminals T2 to T12, L3, and L4 are connected to the control IC 200 with metal wires. The control IC 200 is connected to the gates 14*a* with metal wires.

Terminal B5, B7, and R18 are main terminals. The main terminal B5 has four openings formed therein. The main terminals B7 and R18 are connected to each other. The main terminals B7 and R18 have two openings formed therein. In the mounting step, a block BB11 is placed in a left-side opening of the main terminals B7 and R18, and a block C3 is placed in a right-side opening thereof. Terminals T1, R1 to R17, L1, L2, L5 to L18, B1 to B4, and B6 are dummy terminals.

The semiconductor device according to embodiment 2 of the present invention can be manufactured by the same process of the semiconductor device manufacturing method of embodiment 1. Specifically, in the mounting step, every inter-block space of the lower mold half 100 is filled with a main terminal, a signal terminal, or a dummy terminal described above. Accordingly, the lower mold half 100 and the upper mold half 150 explained in embodiment 1 can be used.

Figure 26:
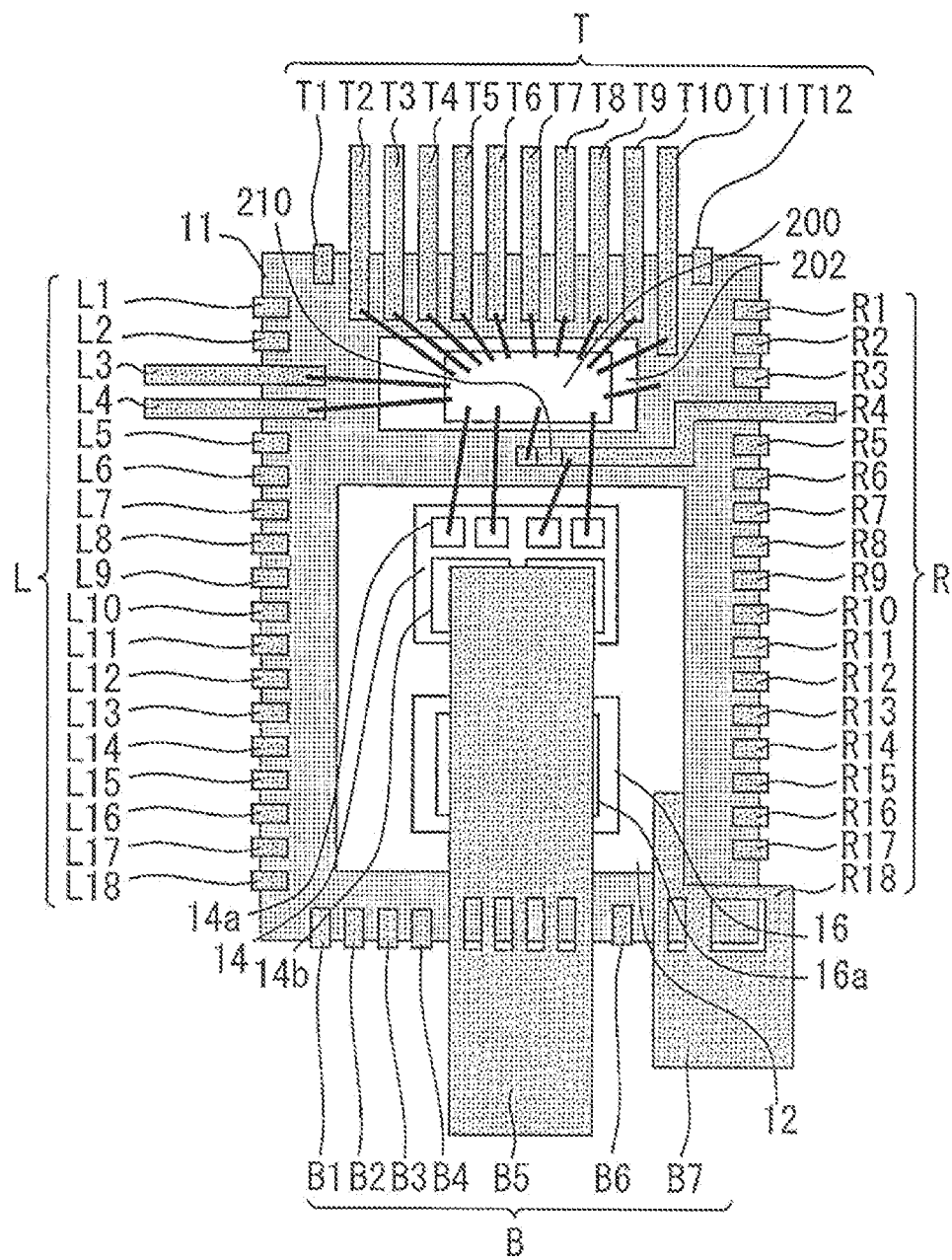
FIG. 26 is a plan view of a semiconductor device according to a modified example.

FIG. 26 is a plan view of a semiconductor device according to a modified example. A gate resistor 210 connecting the control IC 200 and the semiconductor element 14 is provided inside the mold resin 11. The gate resistor 210 is formed in a portion of the signal terminal R4. The gate resistor 210 is formed between the control IC 200 and the semiconductor element 14. One gate 14*a* is connected to the control IC 200 through the gate resistor 210 with metal wires.

Providing the signal terminal R4 and the gate resistor 210 facilitates the evaluation of the semiconductor device. Specifically, the gate resistance can be adjusted by changing specifications of the gate resistor 210. Moreover, a gate signal can be directly inputted from the signal terminal R4 to the gate 14*a*. It should be noted that a part such as a thermistor may be attached to a terminal to evaluate the semiconductor device.

Embodiment 3

Figure 27:
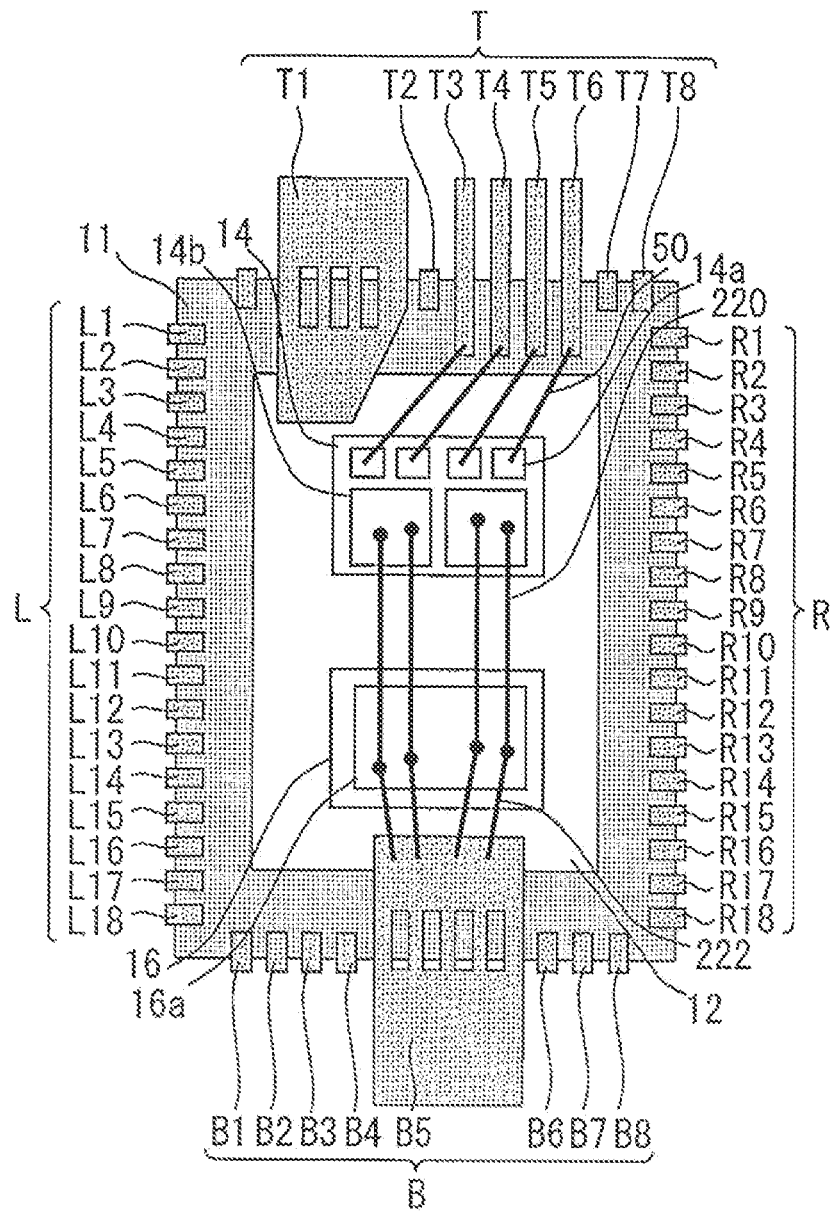
FIG. 27 is a plan view of a semiconductor device according to embodiment 3 of the present invention.

FIG. 27 is a plan view showing the inside of the mold resin 11 of a semiconductor device according to embodiment 3 of the present invention. The emitters 14*b* are connected to the anode 16*a* with metal wires 220. The anode 16*a* is connected to the main terminal B5 with metal wires 222. In the semiconductor device according to embodiment 3 of the present invention, terminals and semiconductor elements can be electrically connected with metal wires.

Figure 28:
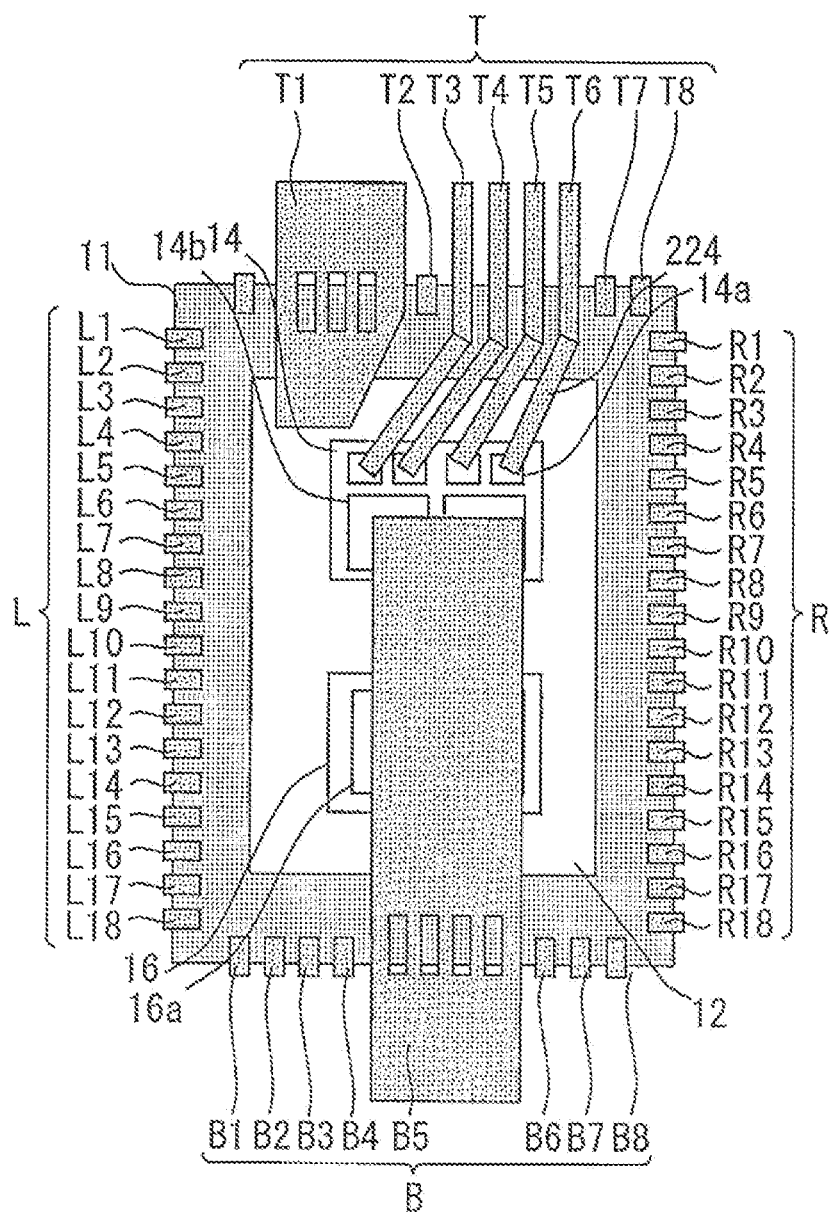
FIG. 28 is a plan view of the semiconductor device according to modified example.

FIG. 28 is a plan view of a semiconductor device according to a modified example. The signal terminals T3 to T6 are connected to the gates 14*a* with four relay terminals 224. The four relay terminals 224 are connected to the terminals T3 to T6 and the gates 14*a*, for example, by ultrasonic bonding or with an electrically conductive adhesive.

Embodiment 4

Figure 29:
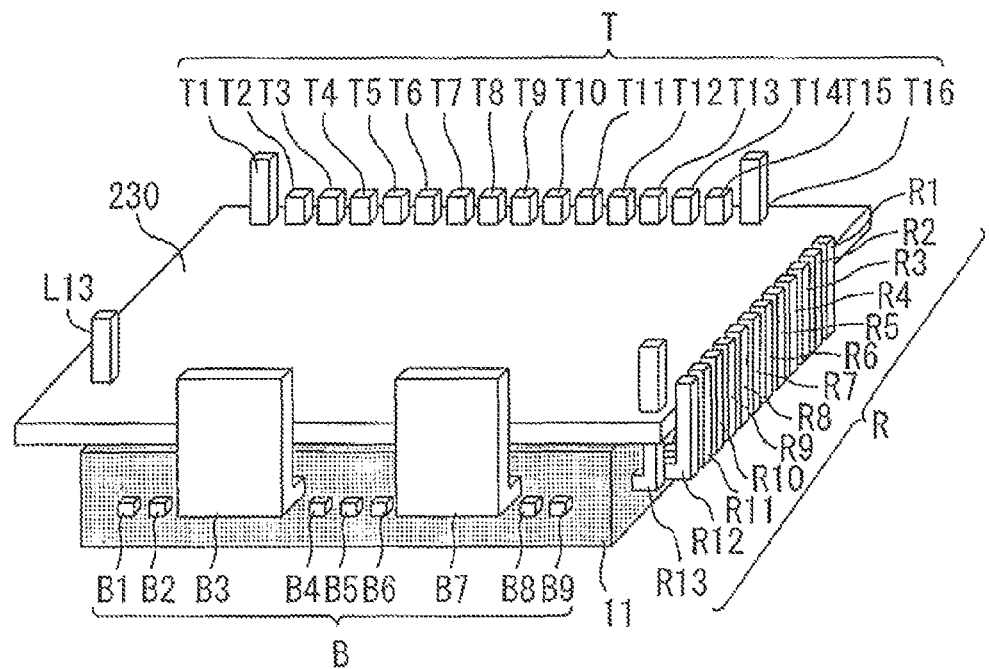
FIG. 29 is a perspective view of a semiconductor device according to embodiment 4 of the present invention.

FIG. 29 is a perspective view of a semiconductor device according to embodiment 4 of the present invention. An external substrate 230 is disposed outside the mold resin 11. Dummy terminals T1 to T16, R13, and L13 pass through the external substrate 230 and are fixed to the external substrate 230 by brazing or welding. The external substrate 230 is, for example, a control board or a radiator fin.

Figure 30:
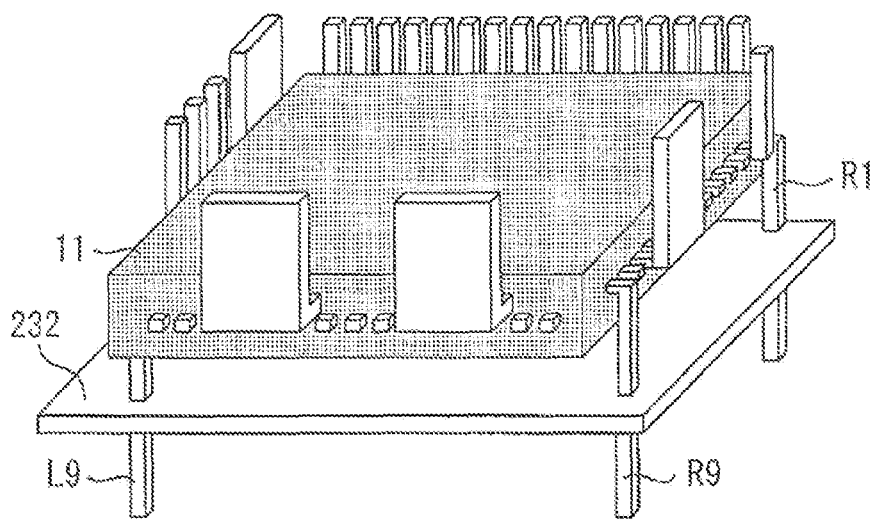
FIG. 30 is a perspective view of a semiconductor device according to a modified example.

The semiconductor device of FIG. 29 can be manufactured by carrying out after the cutting-off step a fixing step of fixing the dummy terminals T1 to T16, R13, and L13 to the external substrate 230. In this way, the use of the dummy terminals for connection with the external substrate 230 makes it possible to omit members for connecting these. FIG. 30 is a perspective view of a semiconductor device according to a modified example. An external substrate 232 is disposed below the mold resin 11. Dummy terminals R1, R9, and L9 pass through the external substrate 232 and are fixed to the external substrate 232.

Embodiment 5

Figure 31:
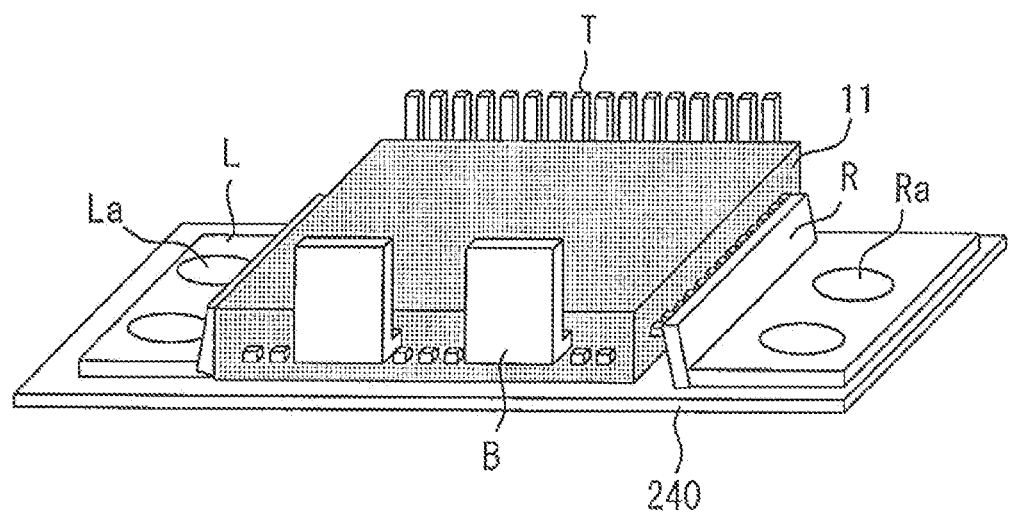
FIG. 31 is a perspective view of a semiconductor device according to embodiment 5 of the present invention.

FIG. 31 is a perspective view of a semiconductor device according to embodiment 5 of the present invention. A plurality of dummy terminals have plate-shaped portions R and L outside the mold resin 11. The plate-shaped portion R is formed such that all the dummy terminals exposed from a right side surface of the mold resin 11 are united. The plate-shaped portion L is formed such that all the dummy terminals exposed from a left side surface of the mold resin 11 are united.

The plate-shaped portions R and L and the external substrate 240 have through-holes Ra and La formed therein. Bolts and nuts are fastened from above and below the through-holes Ra and La to fix the plate-shaped portions R and L to the external substrate 240. This semiconductor device can be manufactured by carrying out after the cutting-off step a fixing step of fixing the plate-shaped portions R and L to the external substrate 240. In this way, dummy terminals formed in the shape of a plate can be used for connection with the external substrate 240.

Figure 32:
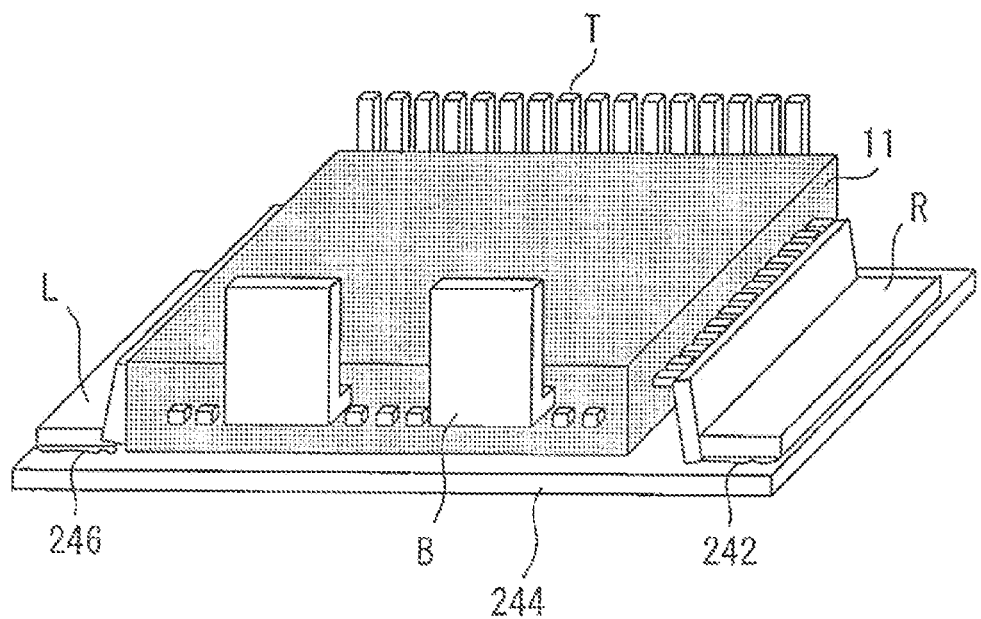
FIG. 32 is a perspective view of a semiconductor device according to a modified example.

FIG. 32 is a perspective view of a semiconductor device according to a modified example. The plate-shaped portion R is fixed to an external substrate 244 with adhesive 242. The plate-shaped portion L is fixed to the external substrate 244 with adhesive 246. Grease may be used instead of an adhesive. The plate-shaped portions R and L of FIGS. 31 and 32 are used for connection with the external substrate and function as radiator fins at the same time. It should be noted that not only dummy terminals but also main terminals or signal terminals may be formed in the shape of a radiator fin.

Figure 33:
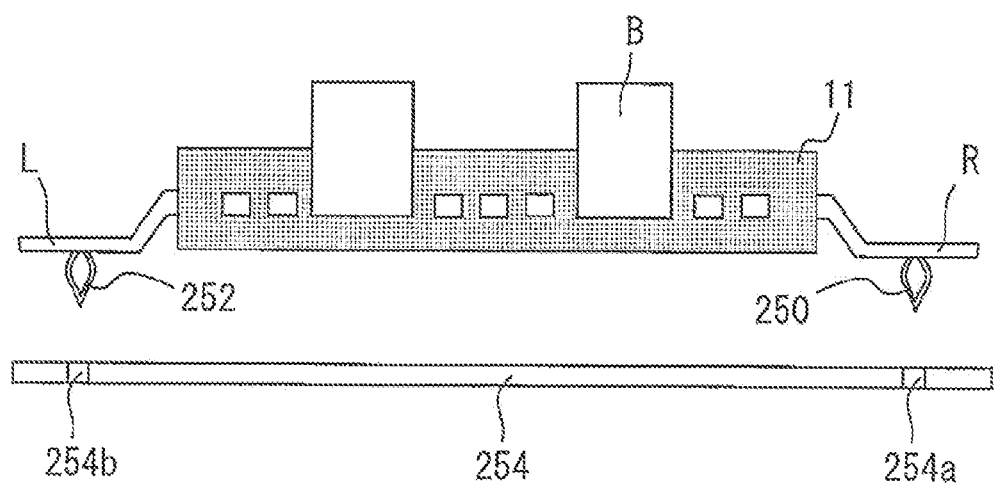
FIG. 33 is a perspective view of a semiconductor device according to another modified example.

FIG. 33 is a perspective view of a semiconductor device according to another modified example. Dummy terminals exposed from a right side surface of the mold resin 11 have a press-fit terminal 250 connected to the plate-shaped portion R. Dummy terminals exposed from a left side surface of the mold resin 11 have a press-fit terminal 252 connected to the plate-shaped portion L. The press-fit terminals 250 and 252 are inserted into openings 254a and 254b of the external substrate 254 to be connected to the external substrate 254 by press fitting. In this way, providing dummy terminals with the press-fit terminal 250 and 252 facilitates connection with the external substrate 254.

Embodiment 6

Figure 34:
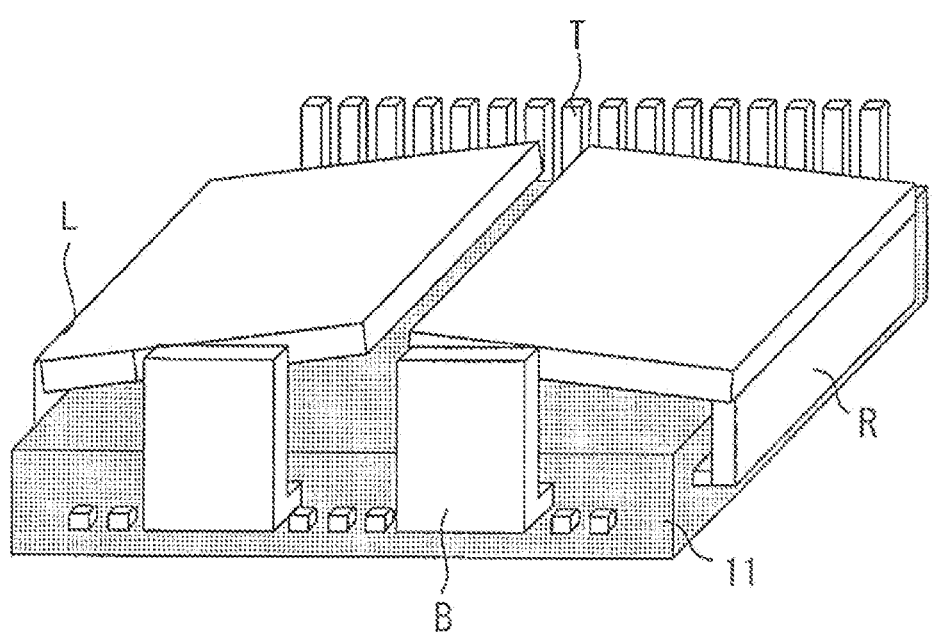
FIG. 34 is a perspective view of a semiconductor device according to embodiment 6 of the present invention.

FIG. 34 is a perspective view of a semiconductor device according to embodiment 6 of the present invention. This semiconductor device has a feature in which a plurality of dummy terminals form plate springs outside the mold resin. All the dummy terminals exposed from a right side surface of the mold resin 11 are united to form a plate spring R. All the dummy terminals exposed from a left side surface of the mold resin 11 are united to form a plate spring L.

A method of manufacturing this semiconductor device will be described. Dummy terminals of the semiconductor device have plate-shaped portions outside the mold resin. After the cutting-off step, a step of bending the plate-shaped portions to form the plate-shaped portions into the plate springs R and L is carried out. The plate springs R and L enables a certain load to be applied when the semiconductor device is attached to an external substrate such as a radiator fin, and can improve the mountability of the semiconductor device. It should be noted that disc springs may be formed instead of the plate springs.

Embodiment 7

Figure 35:
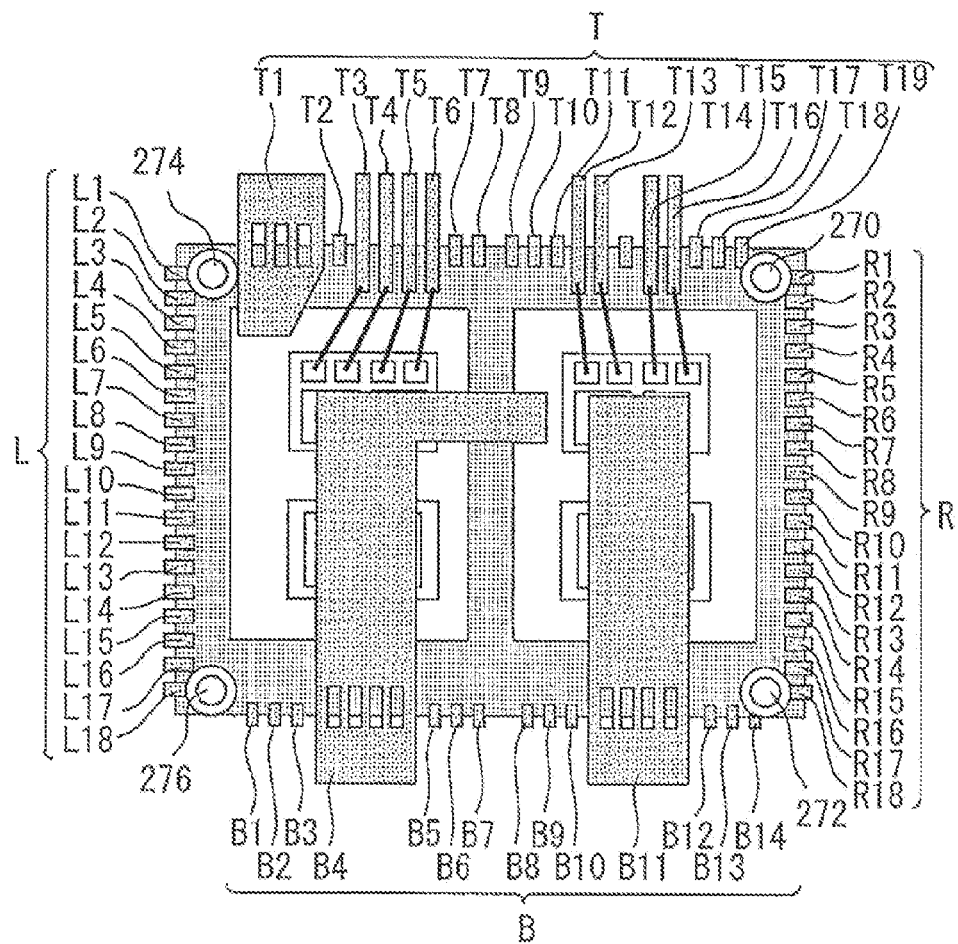
FIG. 35 is a plan view of a semiconductor device according to embodiment 7 of the present invention.

FIG. 35 is a plan view of a semiconductor device according to embodiment 7 of the present invention. Bushes 270, 272, 274, and 276 are formed on portions of dummy terminals R1, R18, L1, and L18, respectively. The bushes 270, 272, 274, and 276 form four through-holes passing through the semiconductor device in the vertical direction. The bushes 270, 272, 274, and 276 are parts for fitting the semiconductor device into shafts, cylindrical members, or the like.

Figure 36:
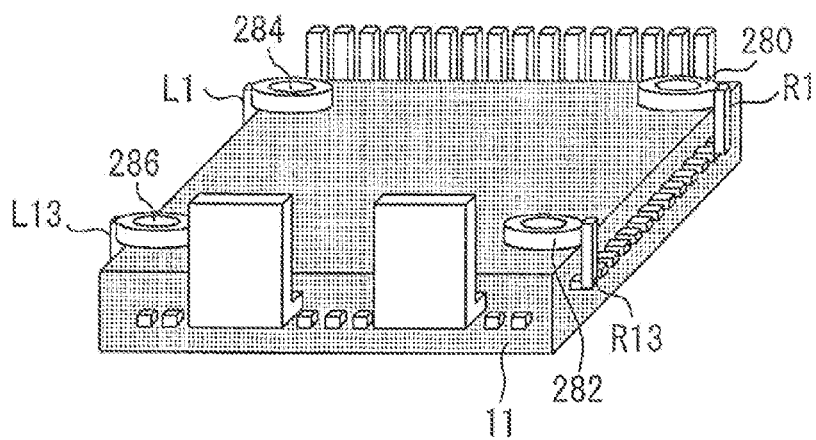
FIG. 36 is a perspective view of a semiconductor device according to modified example.

FIG. 36 is a perspective view of a semiconductor device according to a modified example. The bushes 280, 282, 284, and 286 respectively formed on portions of the dummy terminals R1, R13, L1, and L13 are located on the mold resin 11. Specifically, the bushes may be formed in the mold resin or may be formed outside the mold resin.

Embodiment 8

Figure 37:
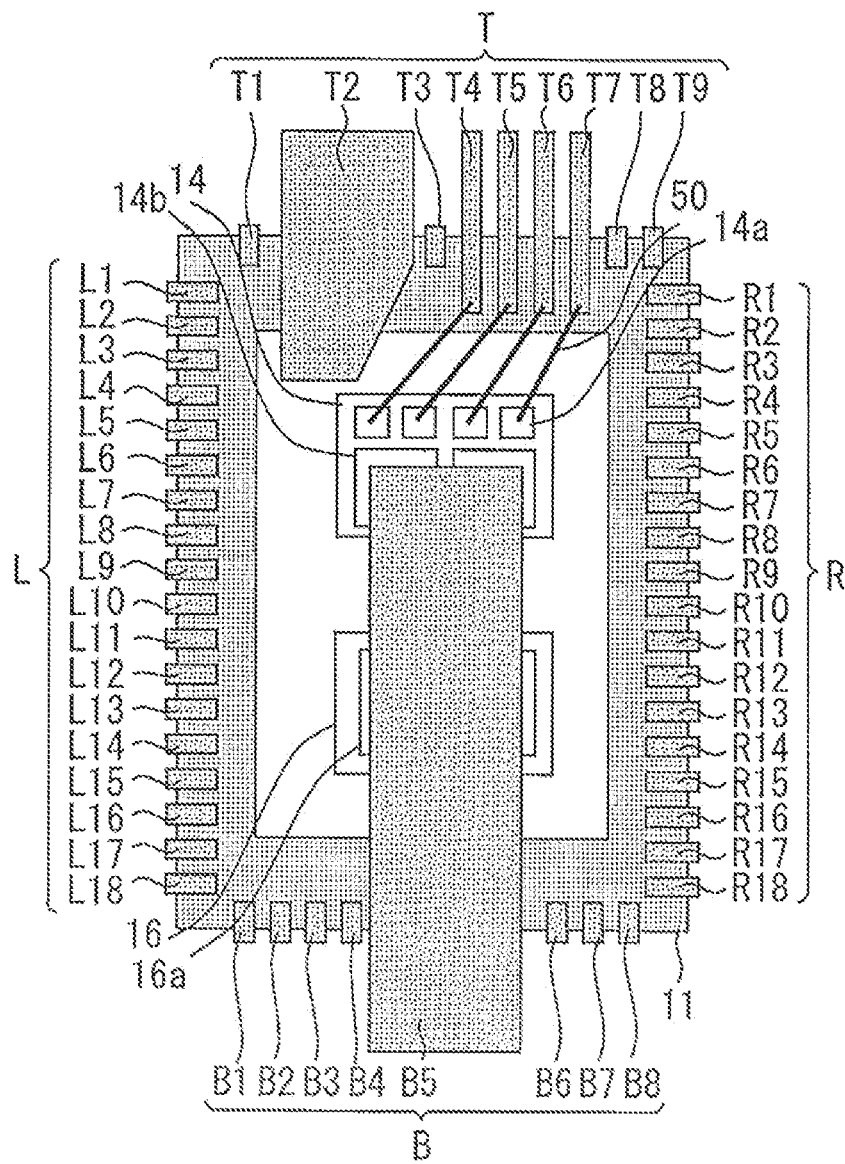
FIG. 37 is a plan view of a semiconductor device according to embodiment 8 of the present invention.

FIG. 37 is a plan view of a semiconductor device according to embodiment 8 of the present invention. Main terminals T2 and B5 have no openings. Accordingly, among inter-block spaces of a lower mold half, the widths of the inter-block spaces in which the main terminals T2 and T5 are placed need to be larger than the width of the inter-block space in which a signal terminal or a dummy terminal is placed. Thus, the semiconductor devices according to embodiments 1 to 7 can be manufactured using a single mold (including the lower mold half 100 and the upper mold half 150), but the semiconductor device according to embodiment 8 needs to be manufactured using a mold different from the foregoing mold.

Figure 38:
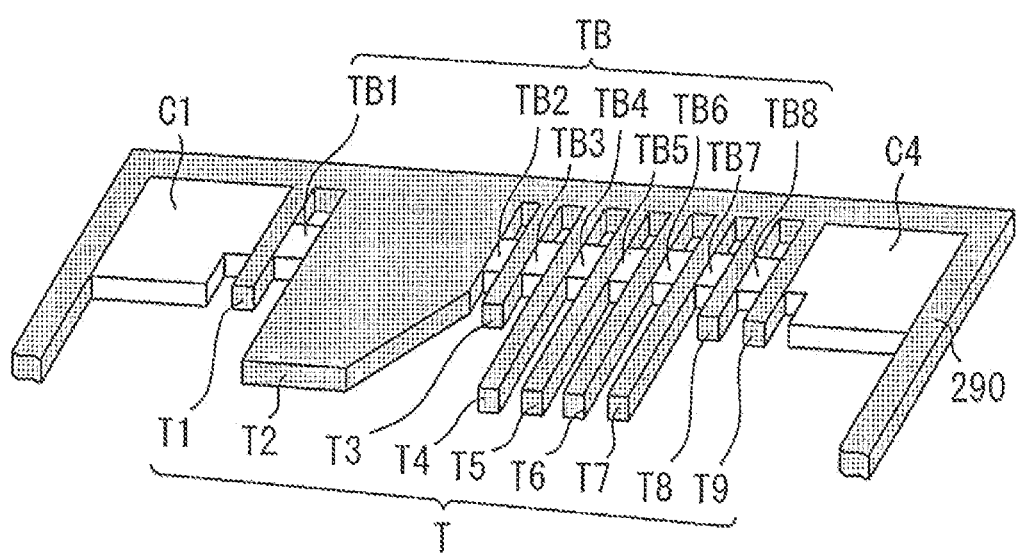
FIG. 38 is a perspective view showing part of a lower mold half used in embodiment 8 of the present invention.

FIG. 38 is a perspective view showing part of a lower mold half used in embodiment 8 of the present invention. The width of the inter-block space between the block TB1 and the block TB2 is formed larger than the widths of other inter-block spaces. In the mounting step, the main terminal T2 of a terminal aggregate 290 is placed in the inter-block space between the block TB1 and the block TB2.

In the semiconductor device according to embodiment 8 of the present invention, wide widths can be maintained over the entire main terminals because the main terminals T2 and B5 have no openings. Accordingly, the current densities in the main terminals T2 and B5 can be reduced. Using the mold used in embodiment 8 of the present invention, a semiconductor device of a different product having a terminal arrangement different from the terminal arrangement of the semiconductor device of FIG. 37 can be manufactured. In that case, the positions of main terminals may be made equal to the positions of the main terminals T2 and B5 of FIG. 37. Alternatively, main terminals having openings of embodiment 1 may be employed, and dummy terminals having large widths may be provided at the positions of the main terminals T2 and B5 of FIG. 37.

Figure 39:
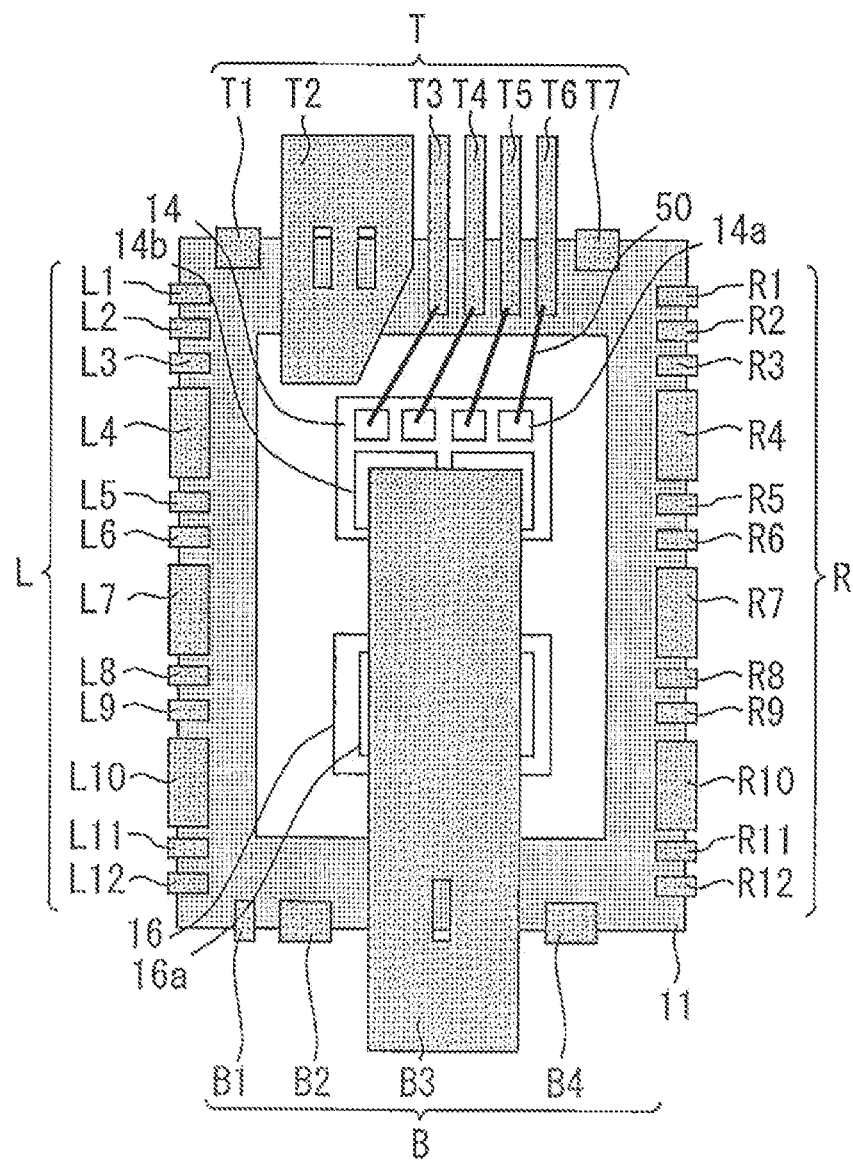
FIG. 39 is a plan view of a semiconductor device according to modified example.

FIG. 39 is a plan view of a semiconductor device according to a modified example. This semiconductor device includes the following dummy terminals: first dummy terminals R1 to R3, R5, R6, R8, R9, R11, R12, L1 to L3, L5, L6, L8, L9, L11, L12, and B1; and second dummy terminals T1, T7, R4, R7, R10, LA, L7, L10, B2, and B4 having larger widths than the first dummy terminals.

In the mounting step, the first dummy terminals are placed in inter-block spaces having small widths, and the second dummy terminals are placed in inter-block spaces having large widths. Main terminals having large widths and no openings can be provided by forming main terminals in portions in which second dummy terminals are formed. For example, a plurality of products are dealt with by replacing a larger number of second dummy terminals by main terminals in a product having a higher current capacity. It should be noted that though the main terminals T2 and B3 of the semiconductor device of FIG. 39 have openings, these may be main terminals having no openings.

Embodiment 9

Figure 40:
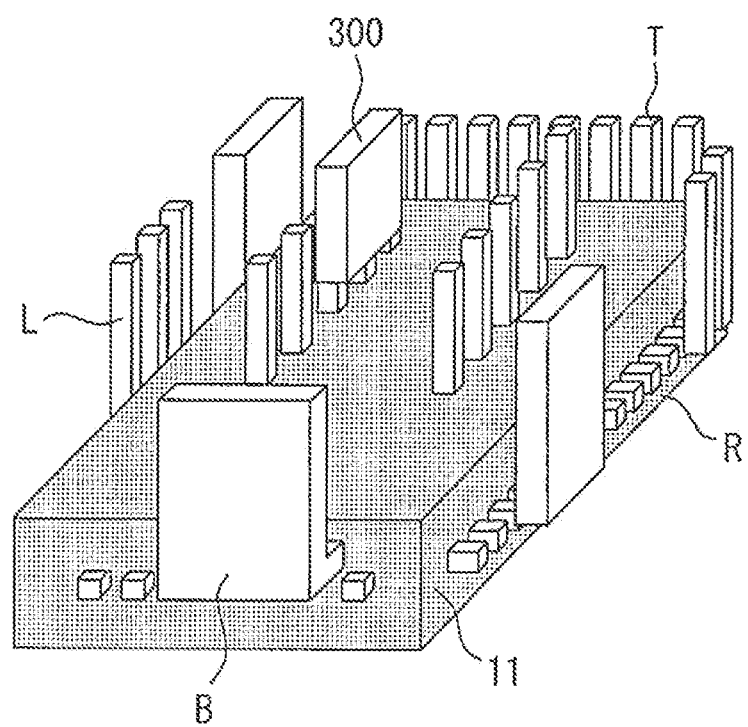
FIG. 40 is a perspective view of a semiconductor device according to embodiment 9 of the present invention.

FIG. 40 is a perspective view of a semiconductor device according to embodiment 9 of the present invention. A terminal 300 is exposed to the outside from a top surface of the mold resin 11. The terminal 300 is a main terminal, a signal terminal, or a dummy terminal. To provide the terminal 300, a hole corresponding to the terminal 300 is formed in the second surface 154 of the upper mold half. It should be noted that the terminal 300 may be exposed to the outside from a bottom surface of the mold resin 11.

Figure 41:
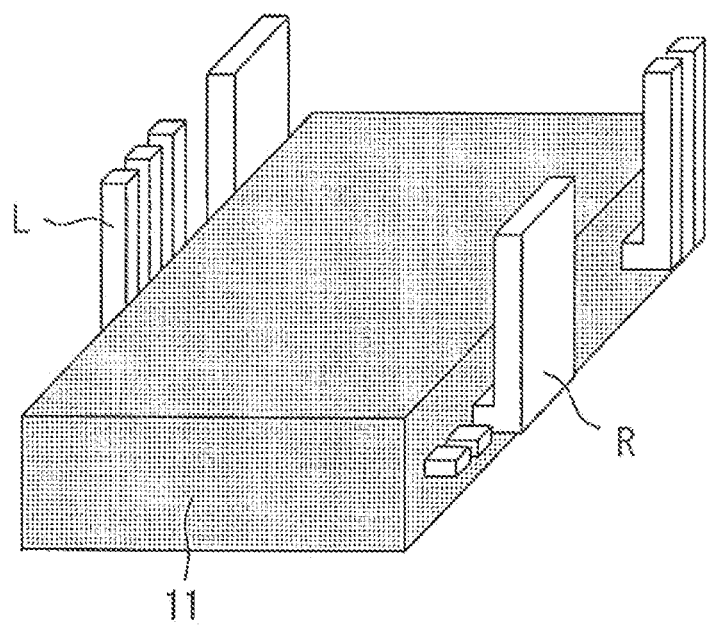
FIG. 41 is a perspective view of a semiconductor device according to modified example.

In this way, terminals may be taken out from any surface of the mold resin 11. FIG. 41 is a perspective view of a semiconductor device according to a modified example. In this semiconductor device, terminals are taken out from only two side surfaces of the mold resin 11.

Embodiment 10

Figure 42:
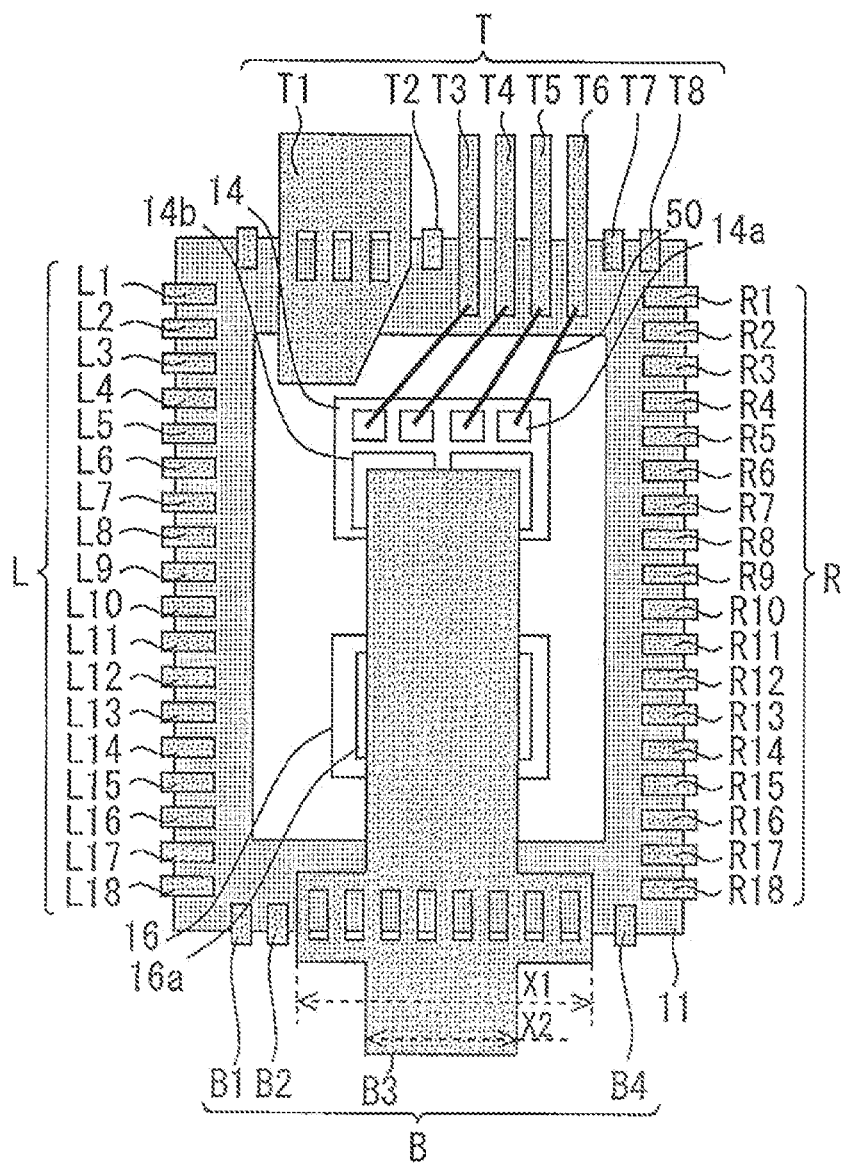
FIG. 42 is a plan view of a semiconductor device according to embodiment 10 of the present invention.

FIG. 42 is a plan view of a semiconductor device according to embodiment 10 of the present invention. The main terminal B3 has openings, and the width of the main terminal B3 is maximum at a portion in which the openings are formed. Specifically, the width X1 of the portion of the main terminal B3 in which the openings are formed is larger than the width X2 of a portion thereof in which the openings are not formed. In the semiconductor device according to embodiment 10 of the present invention, since the portion of the main terminal B3 in which the openings are formed has a larger width than the portion thereof in which the openings are not formed, the current density is prevented from increasing in the portion in which the openings are formed.

Embodiment 11

Figure 43:
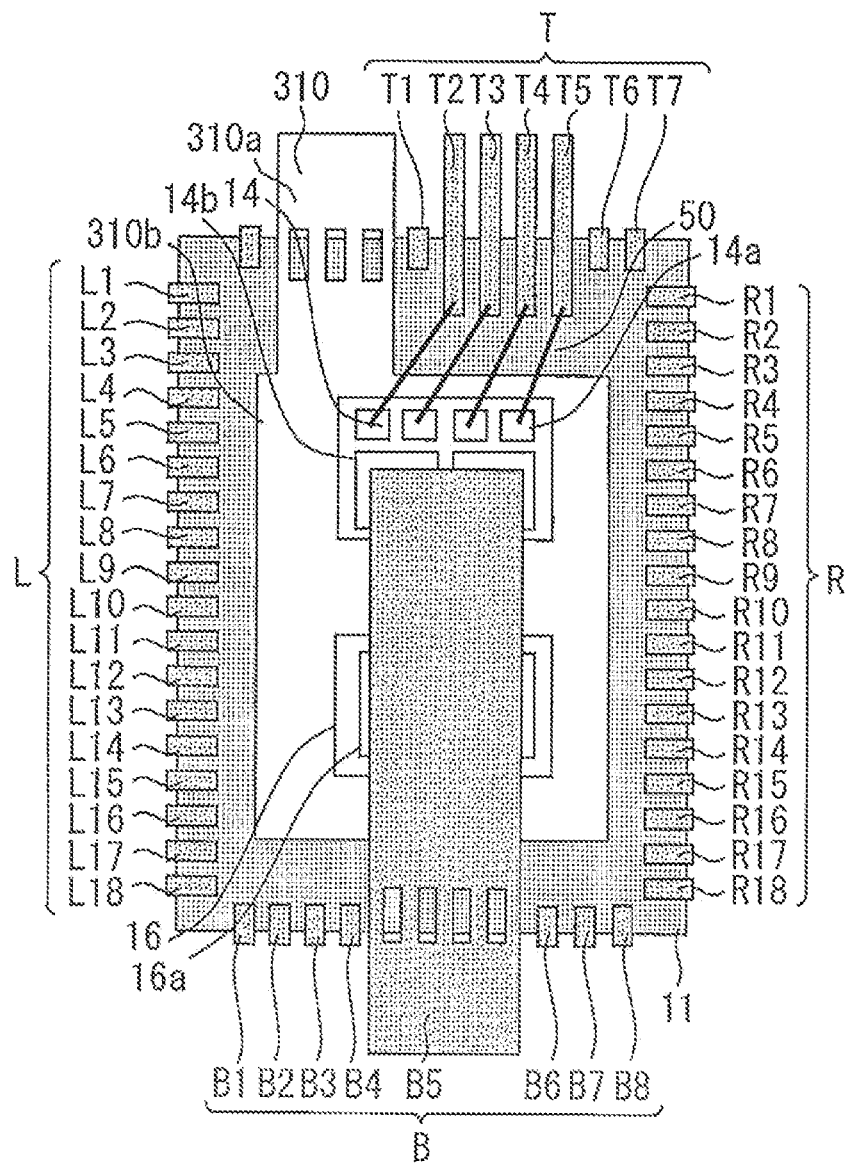
FIG. 43 is a plan view of a semiconductor device according to embodiment 11 of the present invention.

FIG. 43 is a plan view of a semiconductor device according to embodiment 11 of the present invention. A substrate 310 includes an additional main terminal 310a and a body portion 310b connected to the additional main terminal 310a. The additional main terminal 310a is exposed to the outside from a side surface of the mold resin 11. The semiconductor elements 14 and 16 are fixed to the body portion 310b. The additional main terminal 310a functions as a main terminal.

The additional main terminal 310a has three openings formed therein. In the mounting step, blocks are placed in the openings. Further, in the mounting step, the additional main terminal 310a fills four inter-block spaces. In this way, connecting the main terminal and the substrate can be omitted by forming the additional main terminal 310a functioning as a main terminal in a portion of the substrate 310.

It should be noted that the additional main terminal 310a does not have to be provided with openings. In that case, the additional main terminal fills an inter-block space formed to have a large width. Regardless of whether the additional main terminal has openings or not, the additional main terminal fills at least one inter-block space in the mounting step.

Embodiment 12

Figure 44:
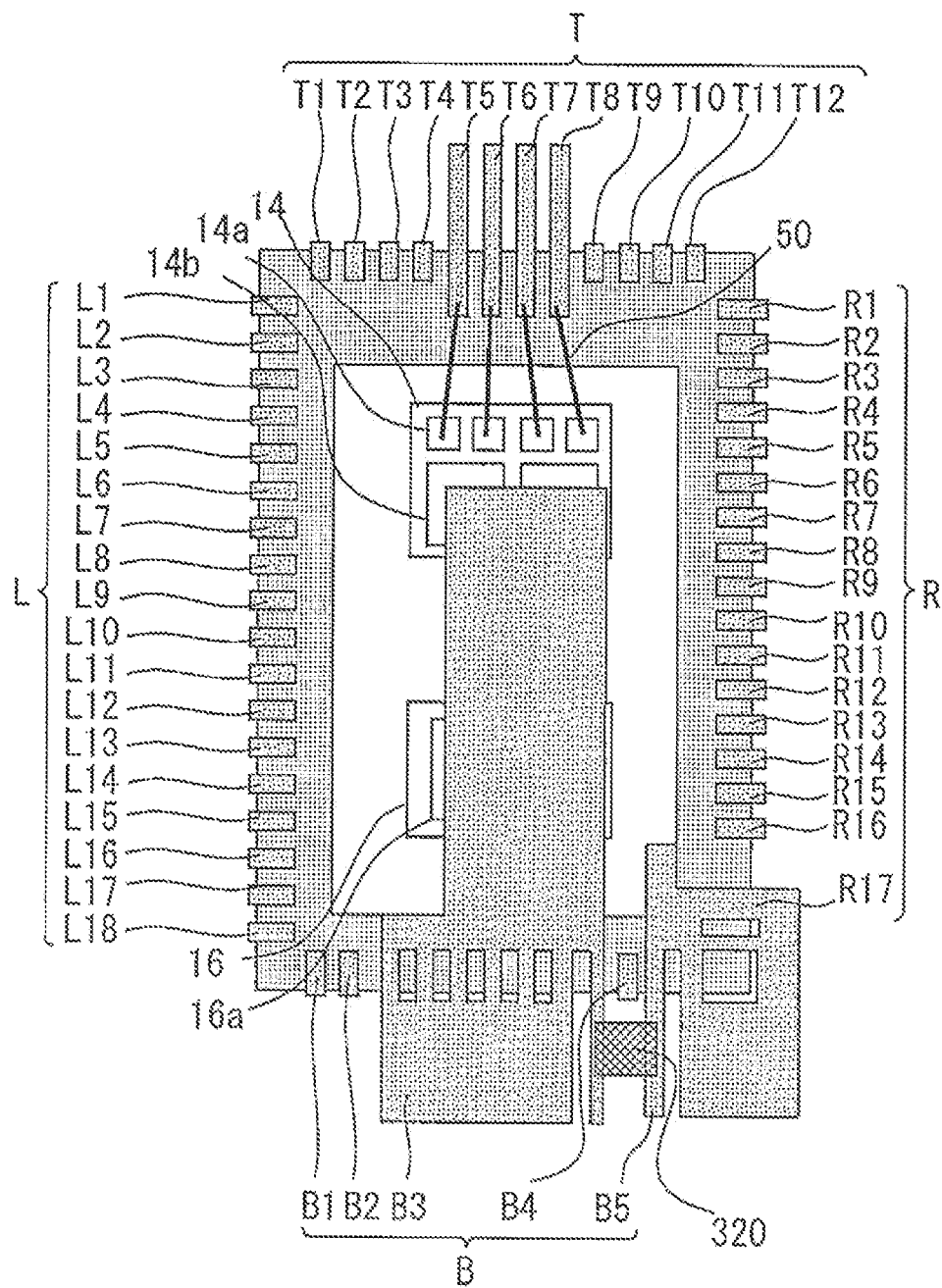
FIG. 44 is a plan view of a semiconductor device according to embodiment 12 of the present invention.

FIG. 44 is a plan view of a semiconductor device according to embodiment 12 of the present invention. This semiconductor device includes the following main terminals: a first terminal B3 connected to front surface electrodes (emitter 14b and anode 16a) of the semiconductor elements 14 and 16; and second terminals B5 and R17 electrically connected to back surface electrodes (collector and cathode) of the semiconductor elements 14 and 16. Further, a capacitor 320 connects the first terminal B3 with the second terminals B5 and R17 outside the mold resin 11. The capacitor 320 provides protection against a surge between p-region and n-region.

Embodiment 13

Figure 45:
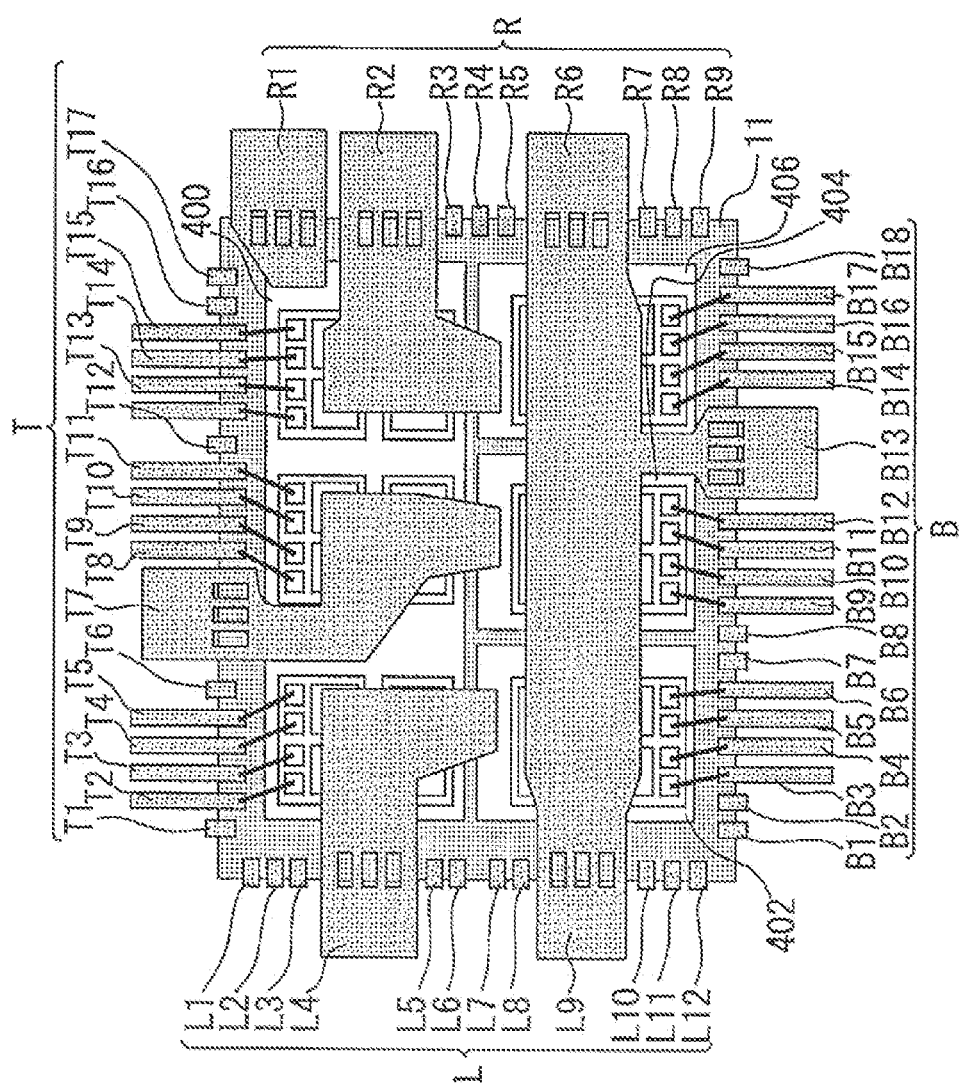
FIG. 45 is a plan view of a semiconductor device according to embodiment 13 of the present invention.

FIG. 45 is a plan view of a semiconductor device according to embodiment 13 of the present invention. This semiconductor device is a 6-in-1 IGBT module including an inverter bridge with six arms. Three upper arms are formed on a substrate 400. A lower arm is formed on each of the substrates 402, 404, and 406.

Figure 46:
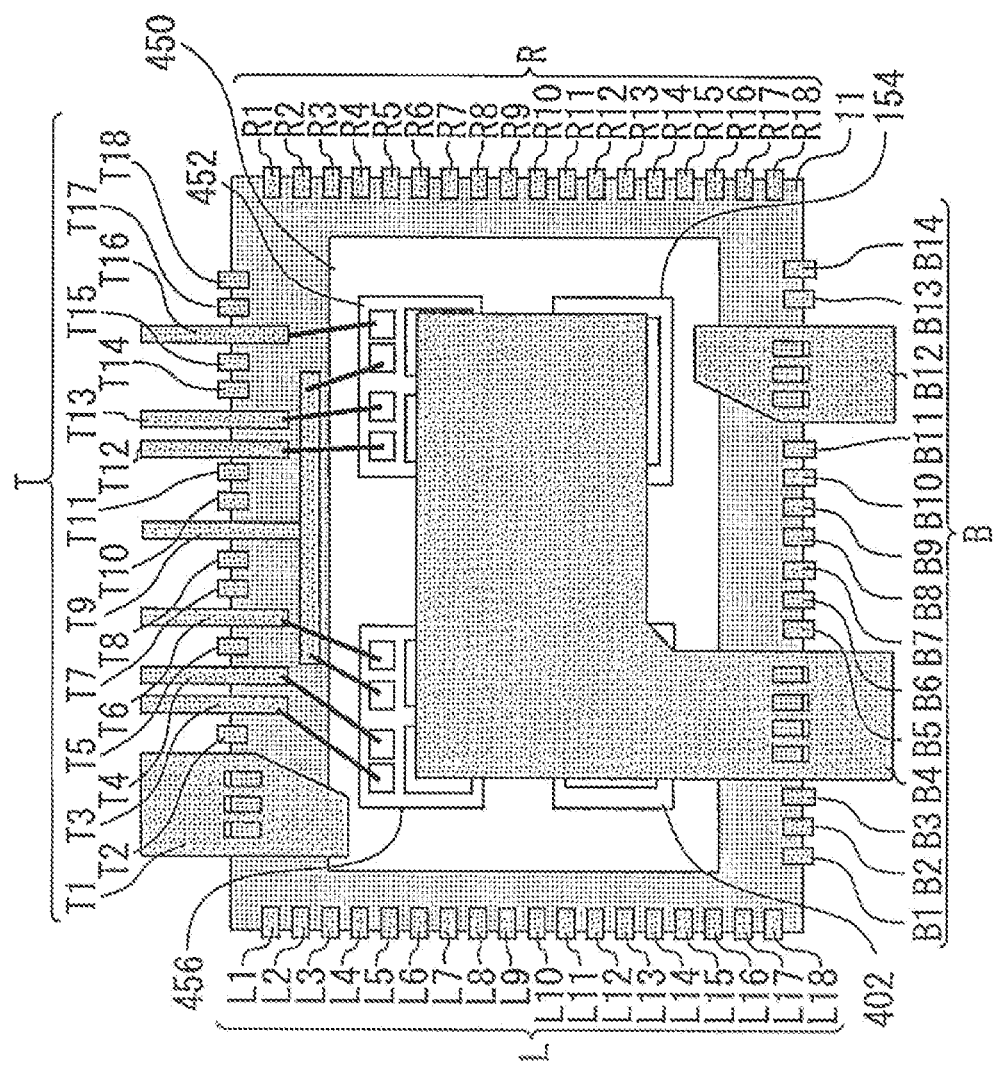
FIG. 46 is a plan view of a semiconductor device according to modified example.

FIG. 46 is a plan view of a semiconductor device according to a modified example. This semiconductor device is a 2-in-1 IGBT module including an inverter bridge with two arms. The semiconductor device of FIG. 45 and the semiconductor device of FIG. 46 can be manufactured using the same mold.

Embodiment 14

FIG. 47 is a perspective view of a semiconductor device according to embodiment 14 of the present invention. The mold resin 11 has an installation through-hole 11a used for screwing or the like. Providing the installation through-hole 11a makes it possible to easily connect the semiconductor device to the outside. It should be noted that features of the semiconductor device manufacturing methods and the semiconductor devices according to the above-described embodiments 1 to 14 may be appropriately combined.

DESCRIPTION OF SYMBOLS 10 semiconductor device, 11 mold resin, T1-T9,R1-R18, L1-L18,B1-B8 terminal, 12 substrate, 14,16 semiconductor element, 14a gate, 14b emitter, 14c collector, 16a anode, 16b cathode, 50 metal wire, 70,180,290 terminal aggregate, 72,182 frame portion, 74,184 to-be-encapsulated body, 100 lower mold half, 102 first surface, 104 second surface, 106 third surface, TB1-TB11,RB1-RB17,LB1-LB17,BB1-BB11,C1-C4 block, 150 upper mold half, 152 first surface, 154 second surface, 160 gap, 162,164 inter-block space, 170 cavity, 200 control IC, 202 substrate, 210 gate resistor, 220,222 metal wire, 224 relay terminal, R,L terminal, 230, 232,240,244,254 external substrate, 250,252 press-fit terminal, 270,272,274,276,280,282,284,286 bush, 310 substrate, 310a additional main terminal, 310b body portion, 320 capacitor.

The invention claimed is:

1. A semiconductor device manufacturing method comprising the steps of:
fixing a semiconductor element to a substrate;
electrically connecting a signal terminal and a main terminal of a terminal aggregate to the semiconductor element, the terminal aggregate comprising a frame portion, the signal terminal connected to an inside of the frame portion, and the main terminal having a larger width than the signal terminal connected to the inside of the frame portion and having an opening formed therein, and forming a to-be-encapsulated body in which the substrate, the semiconductor element, and the terminal aggregate are integrated;
mounting step for mounting the to-be-encapsulated body on a lower mold half such that a plurality of blocks formed in the lower mold half are meshed with the signal terminal and the main terminal with no space left therebetween, with at least one of the plurality of blocks being placed in the opening formed in the main terminal;
after the mounting step, placing a bottom surface of an upper mold half on top surfaces of the plurality of blocks, a top surface of the signal terminal, and a top surface of the main terminal with no space left therebetween to form a cavity for placing the substrate and the semiconductor element; and
molding step for performing molding by injecting mold resin into the cavity.

2. The semiconductor device manufacturing method according to claim 1, further the terminal aggregate comprises, as part thereof, a dummy terminal connected to the inside of the frame portion.

3. The semiconductor device manufacturing method according to claim 1, wherein a width of a portion of the main terminal in which the opening is formed is larger than a width of a portion thereof in which the opening is not formed.

4. The semiconductor device manufacturing method according to claim 1, wherein the substrate is formed of a conductive material, the substrate comprises an additional main terminal and a body portion connected to the additional main terminal, the body portion having the semiconductor element fixed thereto, in the mounting step, the additional main terminal fills at least one of inter-block spaces formed by the plurality of blocks, and the additional main terminal is exposed to an outside from a side surface of the mold resin.

5. The semiconductor device manufacturing method according to claim 1, further comprising, after the molding step, cutting off step of cutting the frame portion off from the signal terminal and the main terminal.

6. A semiconductor device comprising:
a substrate;
a semiconductor element fixed to the substrate;
a signal terminal for transmitting a signal for switching the semiconductor element between on and off;
a main terminal through which a main current of the semiconductor element is passed, the main terminal being formed to have a larger width than the signal terminal; and
a mold resin covering the semiconductor element and the substrate with portions of the signal terminal and the main terminal being exposed to an outside,
wherein the main terminal has an opening outside the mold resin.

7. The semiconductor device according to claim 6, wherein terminals of the semiconductor device include the signal terminal, the main terminal, and a dummy terminal not electrically connected to the semiconductor element.

8. The semiconductor device according to claim 6, further comprising a control IC for controlling the semiconductor element inside the mold resin.

9. The semiconductor device according to claim 8, further comprising a gate resistor connecting the control IC and the semiconductor element inside the mold resin.

10. The semiconductor device according to claim 7, further comprising an external substrate disposed outside the mold resin and fixed to the dummy terminal.

11. The semiconductor device according to claim 10, wherein the dummy terminal passes through the external substrate to be fixed to the external substrate.

12. The semiconductor device according to claim 10, wherein
the dummy terminal comprises a plate-shaped portion outside the mold resin, and
the plate-shaped portion is fixed to the external substrate.

13. The semiconductor device according to claim 10, wherein
the dummy terminal comprises a press-fit terminal, and
the press-fit terminal is inserted into an opening of the external substrate.

14. The semiconductor device according to claim 7, wherein the dummy terminal comprises any one of a plate spring and a disc spring outside the mold resin.

15. The semiconductor device according to claim 7, wherein a shape of a portion of any one of the dummy terminal, the main terminal, and the signal terminal which is outside the mold resin is a shape of a radiator fin.

16. The semiconductor device according to claim 7, wherein a bush is formed on a portion of the dummy terminal.

17. The semiconductor device according to claim 7, wherein the dummy terminals include a first dummy terminal and a second dummy terminal having a larger width than the first dummy terminal.

18. The semiconductor device according to claim 7, wherein any one of the main terminal, the signal terminal, and the dummy terminal is exposed to an outside from any one of a top surface and a bottom surface of the mold resin.

19. The semiconductor device according to claim 6, wherein a width of a portion of the main terminal in which the opening is formed is larger than a width of a portion thereof in which the opening is not formed.

20. The semiconductor device according to claim 6, wherein
the substrate is formed of a conductive material, and
the substrate comprises an additional main terminal exposed to an outside from a side surface of the mold resin and a body portion connected to the additional main terminal, the body portion having the semiconductor element fixed thereto.

21. The semiconductor device according to claim 6, wherein
the main terminals include a first terminal connected to a front surface electrode of the semiconductor element and a second terminal electrically connected to a back surface electrode of the semiconductor element, and
the semiconductor device further comprising a capacitor connecting the first terminal and the second terminal outside the mold resin.

22. The semiconductor device according to claim 6, wherein the mold resin comprises an installation through-hole.

23. The semiconductor device manufacturing method according to claim 2, wherein a width of a portion of the main terminal in which the opening is formed is larger than a width of a portion thereof in which the opening is not formed.

24. The semiconductor device manufacturing method according to claim 2, wherein
the substrate is formed of a conductive material,
the substrate comprises an additional main terminal and a body portion connected to the additional main terminal, the body portion having the semiconductor element fixed thereto,
in the mounting step, the additional main terminal fills at least one of inter-block spaces formed by the plurality of blocks, and
the additional main terminal is exposed to an outside from a side surface of the mold resin.

25. The semiconductor device manufacturing method according to claim 2, further comprising, after the molding step, cutting off step of cutting the frame portion off from the signal terminal, the main terminal, and the dummy terminal.

26. The semiconductor device manufacturing method according to claim 25, further comprising, after the cutting-off step, fixing step of fixing the dummy terminal to an external substrate.

27. The semiconductor device manufacturing method according to claim 26, wherein in the fixing step, the dummy terminal passes through the external substrate to be fixed to the external substrate.

28. The semiconductor device manufacturing method according to claim 26, wherein
the dummy terminal comprises a plate-shaped portion outside the mold resin, and
in the fixing step, the plate-shaped portion is fixed to the external substrate.

29. The semiconductor device manufacturing method according to claim 26, wherein
the dummy terminal comprises a press-fit terminal, and
in the fixing step, the press-fit terminal is inserted into an opening of the external substrate.

30. The semiconductor device manufacturing method according to claim 25, wherein
the dummy terminal comprises a plate-shaped portion outside the mold resin,
the semiconductor device manufacturing method further comprising, after the cutting-off step, the step of bending the plate-shaped portion to form the plate-shaped portion into any one of a plate spring and a disc spring.

* * * * *